(12) United States Patent
Ishida et al.

(10) Patent No.: US 6,461,882 B2
(45) Date of Patent: Oct. 8, 2002

(54) FAULT SIMULATION METHOD AND FAULT SIMULATOR FOR SEMICONDUCTOR INTEGRATED CIRCUIT

(75) Inventors: Masahiro Ishida; Takahiro Yamaguchi, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/880,976

(22) Filed: Jun. 13, 2001

(65) Prior Publication Data

US 2002/0011827 A1 Jan. 31, 2002

(30) Foreign Application Priority Data

Jun. 19, 2000 (JP) ........................................ 2000-183345

(51) Int. Cl.[7] ............................ G01R 31/26; H01L 21/66
(52) U.S. Cl. ............................................. 438/17; 716/6
(58) Field of Search .......................... 716/1–6; 438/17, 438/14–16, 18, 5–13, 800

(56) References Cited

PUBLICATIONS

Henderson et al. "The behavior of testing implications or CMOS IC logic gate open circuits." (Abstract only)Proc. Int'l Test Conf. (IEE CAT No. 91CH3032–0) p. 302.*

* cited by examiner

Primary Examiner—Craig Thompson
(74) Attorney, Agent, or Firm—David N. Lathrop, Esq.; Gallagher & Lathrop

(57) ABSTRACT

A transient power supply current testing technique which affords a high level of observability is used to prepare a list of detectable faults including a gate delay fault, an open fault and a path delay fault. A test pattern sequence formed by two or more test patterns is obtained (202), a train of transition signal values which occur on various signal lines within the circuit when the pattern sequence is applied to operate IC under test is determined by a transition simulation (203), and the train of transition signal values occurring on various signal lines is used to prepare a fault list which are detectable by the transient power supply current testing when the pattern sequence is used to operate the IC under test (204).

5 Claims, 21 Drawing Sheets

FIG. 4a OPEN FAULT CAUSING LOGIC FAULT
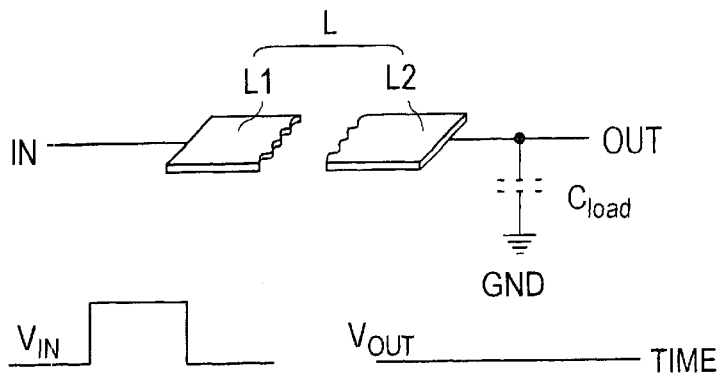
FIG. 4b
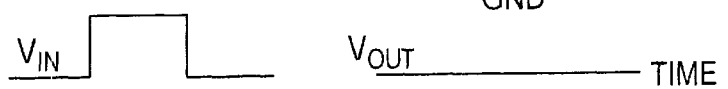
FIG. 4c OPEN FAULT CAUSING DELAY FAULT
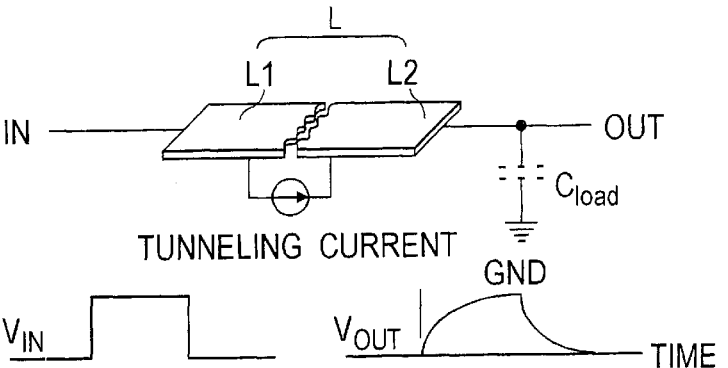
FIG. 4d
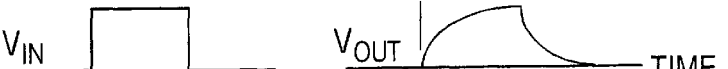

NO FAULT: $i_{DDT}(T'+\tau_0) \leqq I'$
FAULT PRESENT: $i_{DDT}(T'+\tau_0) > I'$ FIG. 10a
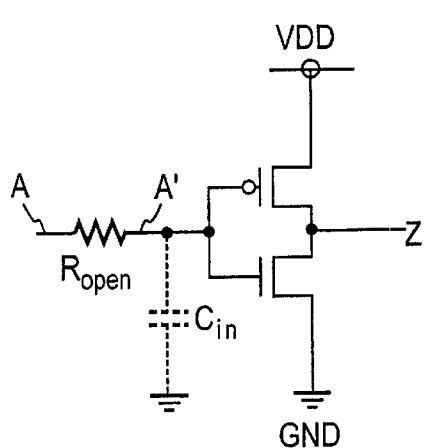
FIG. 10b
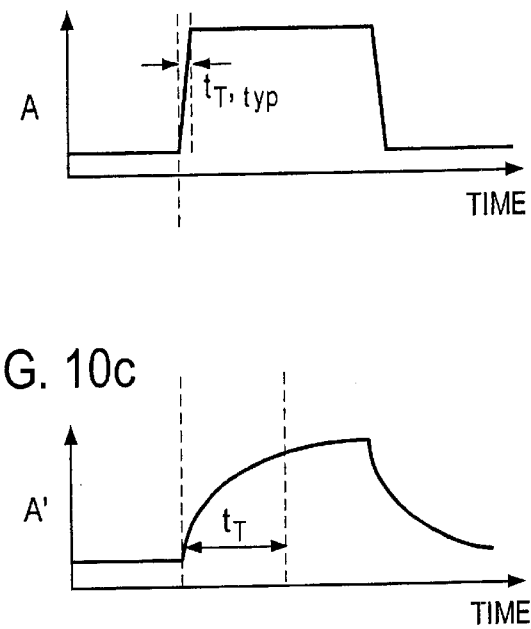
FIG. 10c
FIG. 11
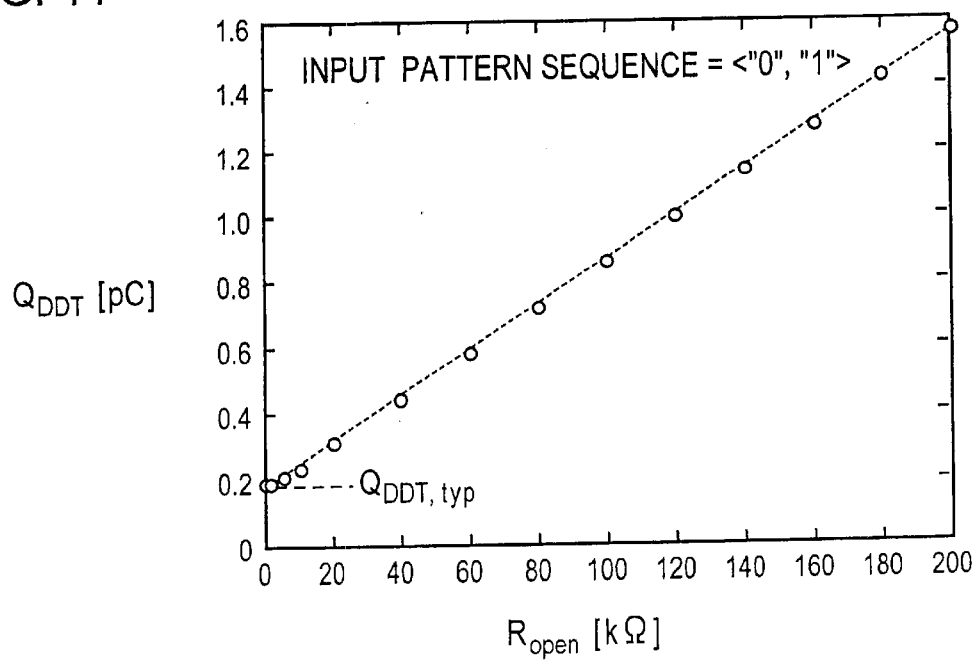

FIG. 15

| IDENTIFIER FOR TEST PATTERN SEQUENCE | INPUT TERMINALS | | | | INTERNAL SIGNALS | | | | | OUTPUT TERMINALS | | DETECTABLE GATE DELAY FAULT |
|---|---|---|---|---|---|---|---|---|---|---|---|---|
| | $x_1$ | $x_2$ | $x_3$ | $x_4$ | $n_1$ | $n_2$ | $n_3$ | $n_4$ | $n_5$ | $z_1$ | $z_2$ | |
| T1 | F | H | H | L | F (1) | R (2) | H | R (4) | L | R (5) | L | $G_1F, G_2R, G_4R$ |
| T2 | F | H | L | L | F (1) | R (2) | F (4) | R (4) | L | R (5) F (7) | L | $G_1F, G_2R, G_3F, G_4R, G_4F$ |
| T3 | F | H | L | H | F (1) | R (2) | F (4) | F (6) | F (5) | R (5) F (7) | F (6) | $G_1F, G_2R, G_3F, G_4R, G_4F, G_5F$ |
| T4 | R | H | L | L | R (1) | F (2) | R (4) | L | L | L | L | $G_1R$ |
| T5 | R | H | L | H | R (1) | F (2) | R (4) | L | R (5) | L | R (6) | $G_1R, G_3R, G_5R$ |
| .... | .... | .... | .... | .... | .... | .... | .... | .... | .... | .... | .... | .... |

FIG. 18

| IDENTIFIER FOR TEST PATTERN SEQUENCE | INPUT TERMINALS ($x_i$) | | | | INTERNAL SIGNAL LINES ($m_j$) | | | | | | | | | | | | | OUTPUT TERMINALS ($z_k$) | | DETECTABLE OPEN FAULTS |
|---|---|---|---|---|---|---|---|---|---|---|---|---|---|---|---|---|---|---|---|---|
| | 1 | 2 | 3 | 4 | 1 | 2 | 3 | 4 | 5 | 6 | 7 | 8 | 9 | 10 | 11 | 12 | 13 | 1 | 2 | |
| T1 | F | H | H | L | F(0) | H | H | L | F(1) | F(1) | F(1) | R(2) | H | H | H | R(4) | L | R(5) | L | $m_1, m_5, m_6, m_8, m_{12}$ |
| T2 | F | H | L | L | F(0) | H | L | L | F(1) | F(1) | F(1) | R(2) | F(4) | F(4) | F(4) | R(4) / F(6) | L | R(4) / F(6) | L | $m_1, m_5, m_6, m_7, m_8,$ $m_9, m_{10}, m_{12}$ |
| T3 | F | H | L | H | F(0) | H | L | H | F(1) | F(1) | F(1) | R(2) | F(4) | F(4) | F(4) | F(6) | F(5) | F(6) | F(5) | $m_1, m_5, m_6, m_7,$ $m_8, m_9, m_{10}, m_{11},$ $m_{12}, m_{13}$ |
| T4 | R | H | L | L | R(0) | H | L | L | R(1) | R(1) | R(1) | F(2) | R(4) | R(4) | R(4) | L | L | L | L | $m_1, m_5, m_6, m_7$ |
| T5 | R | H | L | H | R(0) | H | L | H | R(1) | R(1) | R(1) | F(2) | R(4) | R(4) | R(4) | L | R(5) | L | R(5) | $m_1, m_5, m_6, m_7,$ $m_9, m_{11}, m_{13}$ |
| ..... | ..... | ..... | ..... | ..... | ..... | ..... | ..... | ..... | ..... | ..... | ..... | ..... | ..... | ..... | ..... | ..... | ..... | ..... | ..... | ..... |

FIG. 20

| IDENTIFIER FOR TEST PATTERN SEQUENCE | INPUT TERMINALS | | | | INTERNAL SIGNALS | | | | | OUTPUT TERMINALS | | DETECTABLE PATH DELAY FAULT |
|---|---|---|---|---|---|---|---|---|---|---|---|---|
| | $x_1$ | $x_2$ | $x_3$ | $x_4$ | $n_1$ | $n_2$ | $n_3$ | $n_4$ | $n_5$ | $z_1$ | $z_2$ | |
| T1 | F | H | H | L | F (1) | R (2) | H | R (4) | L | R (5) | L | $\{x_1, n_1, n_2, n_4, z_1\}$ |
| T2 | F | H | L | L | F (1) | R (2) | F (4) | R (4) | L | R (5) | L | $\{x_1, n_1, n_3, n_4, z_1\}$ |
| T3 | F | H | | H | F (1) | R (2) | F (4) | F (6) | F (5) | F (7) | F (6) | $\{x_1, n_1, n_3, n_4, z_1\}$ $\{x_1, n_1, n_3, n_5, z_2\}$ |
| T4 | R | H | L | L | R (1) | F (2) | R (4) | L | L | L | L | |
| T5 | R | H | L | H | R (1) | F (2) | R (4) | L | R (5) | L | R (6) | $\{x_1, n_1, n_3, n_5, z_2\}$ |
| .... | .... | .... | .... | .... | .... | .... | .... | .... | .... | .... | .... | .... |

FAULT SIMULATION METHOD AND FAULT SIMULATOR FOR SEMICONDUCTOR INTEGRATED CIRCUIT

BACKGROUND OF THE INVENTION

The invention relates to a fault simulation method and a fault simulator which prepare a fault list occurring in a semiconductor integrated circuit which can be detected with a test pattern sequence.

According to a conventional practice, a fault simulation of a semiconductor integrated circuit comprises assuming a fault within the integrated circuit, calculating an output value from an output terminal in response to a given test pattern by a logic simulation, determining a fault in which a change occurs as compared with an output value of a fault-free arrangement, assembling such results into a table of correspondence between assumed faults and input/output logic values, which is commonly referred to as a fault dictionary, thus preparing a fault list which can be detected with individual test patterns. When testing a semiconductor integrated circuit, each test pattern is applied to the input of the semiconductor integrated circuit, and the resulting output value and the input are used in making a reference to the fault dictionary in order to estimate whether or not there is a fault in the integrated circuit or/and where in the integrated circuit the fault is located.

In order to accommodate for a fault which does not give rise to a wrong logic such as a short-circuit fault or a current leak fault, there is proposed a fault simulation method which combines the logic simulation with IDDQ (quiescent power supply current) testing technique. According to this method, a logic signal value on a signal line within the integrated circuit which would occur in response to a test pattern is calculated by the logic simulation. By assuming faults within the integrated circuit to enumerate a variety of faults which satisfy requirements for the occurrence of an abnormality in IDDQ, a list of detectable faults is prepared. When a test pattern is input to the integrated circuit, each signal line in the integrated circuit normally assumes either "0" or "1" logic value. Accordingly, if a short-circuit fault occurs between a signal line having a logic value of "0" and a signal line having a logic value of "1" in the integrated circuit in response to the application of the test patter, an IDDQ abnormality occurs in the integrated circuit. In this manner, for any combination of a signal line having a logic value of "0" and a signal line having a logic value of "1" in the integrated circuit, a short-circuit fault which occurs between the both kinds of signal lines can be detected by the IDDQ testing technique in response to the input test pattern. When these short-circuit faults are enumerated, a fault list which can be detected with the IDDQ testing technique can be prepared.

However, the fault simulation method which employs the logic simulation can only deal with a fault model in which a signal line is fixed to a given state (either "0" or "1", or a single stuck-at fault, namely stuck-at 0 or stuck-at 1). This prevents a sensitive simulation of a multiple stuck-at fault in which a plurality of signal lines are fixed to either "0" or "1", a delay fault, a short-circuit fault between signal lines or the like. Accordingly, this fault simulation method cannot prepare a list of detectable faults for these faults.

Another difficulty of the fault simulation method which combines the logic simulation with the IDDQ testing technique is the fact that it is incapable of preparing a list of detectable faults for those faults related to a transient phenomenon of a semiconductor integrated circuit such as a delay fault or an open fault which influences upon a delay time or an abnormality in a local or global process parameter (such as sheet resistance, an oxide film thickness of the like) for example, inasmuch as the IDDQ testing technique is directed to determining a power supply current in the stable condition of the semiconductor integrated circuit or is principally directed to short-circuit faults in the circuit.

Accordingly, there is a need for a fault simulation method capable of preparing a fault list which are detectable with a test pattern sequence for faults including a delay fault, an open fault or a parametric abnormality fault in an integrated circuit.

It is an object of the invention to provide a fault simulation method and a fault simulator capable of preparing a fault list which are detectable with test pattern sequence for delay faults, open faults and parametric abnormality faults in a semiconductor integrated circuit, by using the IDDT (transient power supply current) testing technique which affords a high level of observability and capable of testing transient phenomena in the circuit in combination with a transition simulation.

DISCLOSURE OF THE INVENTION

According to the present invention, there is provided a method of preparing a fault list which are detectable with input test pattern sequence, comprising a step of deriving a test pattern sequence formed by two or more test patterns and which is to be applied to a semiconductor integrated circuit under test, a step of performing a transition simulation of an operation of the semiconductor integrated circuit under test when each test pattern in the derived test pattern sequence is applied thereto to calculate a train of transition signal values occurring on signal lines within the semiconductor integrated circuit under test, and a step of preparing a fault list which can be detected by the transient power supply current testing which uses the test pattern sequence, by utilizing the train of transition signal values on signal lines which are calculated by the transition simulation.

With this method, it is possible to prepare a fault list which are detectable by the transient power supply current testing which uses given test patterns, for those faults which have been difficult to detect in the prior art, namely, delay faults and open faults which give rise to delay faults, thus allowing a substantial improvement in the efficiency of testing against delay faults and open faults.

In one form of the step of preparing the fault list, the fault list is prepared in unit of a delay fault of a logic gate.

In another form of the step of preparing the fault list, the fault list is prepared in unit of an open fault in a signal line.

In a further form of the step of preparing the fault list, the fault list is prepared in unit of a path delay fault on a signal transmission path.

The present invention also provides a fault simulator which prepares a fault list which are detectable with an input test pattern sequence, comprising a test pattern sequence selector for deriving a test pattern sequence formed by two or more test patterns and which is to be applied to a semiconductor integrated circuit under test, a transition simulator which receives the derived test pattern sequence and performs a transition simulation of the operation of the semiconductor integrated circuit under test when each test pattern of the sequence is input thereto to calculate a train of transition signal values occurring on signal lines within the semiconductor integrated circuit under test, and a fault list preparing unit for preparing a fault list which are detectable by the transient power supply current testing which uses the test pattern sequence, by utilizing the train of transition signal values on signal lines which are calculated by the transition simulator.

The fault simulator allows a fault list which are detectable by the transient power supply current testing which uses certain test pattern to be prepared, for a delay fault or an open fault which leads to a delay fault, either of which has been difficult in the prior art to detect, thus permitting the testing efficiency for the delay faults and the open faults to be significantly improved.

In the description to follow, the principle of the present invention will be described in terms of a CMOS integrated circuit which is a most common semiconductor integrated circuit.

Transient current of CMOS logic gate

FIG. 1 shows a transient response of a CMOS inverter shown in FIGS. 1c and d. The transient response has been determined with a circuit simulator. FIG. 1a shows a response of an output voltage $V_{OUT}$ with respect to an input voltage $V_{IN}$ in a transient condition, while FIG. 1b shows a response of a current $I_{DD}$ which flows from a power supply into the CMOS inverter. The current $I_{DD}$ is referred to as a transient current. When the input IN of the inverter transitions from "1" to "0" (see FIG. 1c), n-MOS and P-MOS are only momentarily turned on as long as the input voltage is higher than the threshold voltage of n-MOS and lower than the threshold voltage of P-MOS, whereby a short-circuit current Is flows from a power supply terminal $T_{VD}$ to a ground GND. An output OUT from an output signal line of the inverter then transitions from "0" to "1", and accordingly, at the same time as the short-circuit current $I_S$, a current $I_C$ which is associated with a capacitance charging of a parasitic capacitance $C_{load}$ connected to the output signal line of the inverter flows from the power supply terminal $T_{VD}$ to the parasitic capacitance $C_{load}$. Accordingly, when a falling transition (denoted by suffix "f") occurs on the input IN of the inverter, the transient current $I_{Gf}$ which flows into the inverter is given by the sum of the short-circuit current $I_{Sf}$ and the capacitance charging current $I_C$.

$$I_{Gf} = I_{Sf} + I_C \quad (1)$$

On the other hand, when the input IN transitions from "0" to "1" or when the output transitions from "1" to "0" (denoted by suffix "r") (see FIG. 1d), a capacitance discharge occurs from the parasitic capacitance $C_{load}$ connected to the output signal line, thus producing a capacitance discharge current $I_D$, but the current $I_{Gr}$ which flows from the power supply terminal $T_{VD}$ to the inverter comprises only the short-circuit current $I_{Sr}$. Accordingly, a peak of the current $T_{VD}$ is slightly smaller than the peak of the transient current $I_{Gf}$ which occurs during the falling transition as shown in FIG. 1b.

$$I_{Gr} = I_{Sr} \quad (2)$$

The CMOS inverter has a transfer characteristic which is such that a triangular pulse current $I_S$ is produced in response to a change in the input voltage $V_{IN}$, as shown in FIG. 2a. Accordingly, when a rising transition occurs on the input of the CMOS inverter, the short-circuit current waveform $I_{Sr}$ which flow through the CMOS inverter can be approximated by a triangular pulse, as indicated by "$I_S$" in FIG. 2b, assuming a ramp transition for the input voltage $V_{IN}$. The short-circuit current waveform $I_{Sr}$ with respect to the rising transition of the input signal as indicated in FIG. 2b can be given by the following approximations:

$$I_{Sr} = \begin{cases} 0, & t \leq \frac{V_{THN}}{V_{DD}} t_r \\ \frac{V_{DD} \cdot I_{Smax}}{(V_{SP} - V_{THN}) \cdot t_r} t - \frac{V_{THN} \cdot I_{Smax}}{(V_{SP} - V_{THN})}, & \frac{V_{THN}}{V_{DD}} t_r < t \leq \frac{V_{SP}}{V_{DD}} t_r \\ \frac{V_{DD} \cdot I_{Smax}}{(V_{SP} - V_{DD} + V_{THP}) \cdot t_r} t - \frac{(V_{DD} - V_{THP}) \cdot I_{Smax}}{(V_{SP} - V_{DD} + V_{THP})}, & \frac{V_{SP}}{V_{DD}} t_r < t \leq \frac{V_{DD} - V_{THP}}{V_{DD}} t_r \\ 0, & t \geq \frac{V_{DD} - V_{THP}}{V_{DD}} t_r \end{cases} \quad (3)$$

where $I_{Smax}$ represents a maximum value of the transient current (short-circuit current) which flows into the CMOS inverter, $V_{DD}$ represents a power supply voltage, $V_{THN}$ a threshold voltage of n-MOS transistor, $V_{THP}$ a threshold voltage of a P-MOS transistor and $t_r$ a time interval for the rising transition of the input signal. It is to be noted that $V_{THP}$ is indicated in its absolute magnitude. To simplify the approximations, it is assumed that the transition of the input voltage $V_{IN}$ begins at time 0, and the input voltage reaches to $V_{DD}$ at time $t_r$ which represents the completion of the transition.

Similarly, the short-circuit current waveform $I_{Sf}$ of the CMOS inverter in response to the falling transition of the input signal can be given by the following approximations:

$$I_{Sf} = \begin{cases} 0, & t \leq \frac{V_{THP}}{V_{DD}} t_f \\ \frac{V_{DD} \cdot I_{Smax}}{(V_{DD} - V_{THP} - V_{SP}) \cdot t_f} t - \frac{V_{THP} \cdot I_{Smax}}{(V_{DD} - V_{THP} - V_{SP})}, & \frac{V_{THP}}{V_{DD}} t_f < t \leq \frac{V_{DD} - V_{SP}}{V_{DD}} t_f \\ \frac{V_{DD} \cdot I_{Smax}}{(V_{THN} - V_{SP}) \cdot t_f} t - \frac{(V_{DD} - V_{THN}) \cdot I_{Smax}}{(V_{THN} - V_{SP})}, & \frac{V_{DD} - V_{SP}}{V_{DD}} t_f < t \leq \frac{V_{DD} - V_{THN}}{V_{DD}} t_f \\ 0, & t \geq \frac{V_{DD} - V_{THN}}{V_{DD}} t_f \end{cases} \quad (4)$$

where $t_f$ represents a time interval for the falling transition of the input signal. For the sake of convenience, times for the start of the rising transition of the power supply current, the maximum value $I_{Smax}$ and the end of the falling transition are indicated in parentheses in FIG. 2b.

Denoting a voltage change on the output signal line by $v_{out}$ (t), the charging current $I_C$ to the parasitic capacitance $C_{load}$ connected to the output signal line of the CMOS inverter is given by the following equation:

$$I_C = C_{load} \frac{dv_{out}(t)}{dt} \tag{5}$$

Such equations can be similarly determined for logic gates other than the inverter.

Assuming that the transient current $I_G$ which flows into a logic gate is substantially short-circuit current, it can be approximated by a triangular pulse as indicated by $I_s$ in FIG. 2b. In actuality, the transient current waveform $I_G$ of the CMOS inverter represents a triangular pulse as shown in FIG. 1b. Accordingly, the transient current $I_G$ of the logic gate increases monotonously until the maximum value $I_{Smax}$ is reached whereupon it decreases monotonously, as shown in FIG. 2b. The transient current $I_G$ reaches its maximum value $I_{Smax}$ when the input voltage $V_{IN}$ reaches the switching voltage $V_{SP}$ for the logic gate. Specifically, as shown in FIG. 2b, the time when the current $I_G$ reaches its peak coincides with the time of input transition of the logic gate. Because the logic gate has a delay time, the time for the output transition of the logic gate will be slightly lagging with respect to the time for the input transition. Thus, the time when the current $I_G$ reaches its peak slightly precedes the time for the output transition of the logic gate. In this instance, the falling edge of the transient current waveform $I_G$ may be considered as coincident with the time for the output transition. In addition, the transient current waveform $I_G$ of the logic gate has a pulse width which is proportional to the transition time of the input voltage (for example the time interval $t_r$ for the rising transition).

In the above description, it has been assumed that the transient current $I_G$ which flows into the logic gate is substantially a short-circuit current $I_S$. However, with a miniaturization of a CMOS manufacturing process, the wiring delay will be more dominant over the gate delay. This means that assuming a constant transition time interval for the input voltage, the proportion of the charging current $I_C$ to the output signal line will be greater than the proportion of the short-circuit current $I_S$ in the transient current $I_G$ which flows into the CMOS logic gate. Accordingly, the time when the transient current waveform of the logic gate reaches its peak depends on the ratio of the charging current $I_C$ to the short-circuit current $I_S$. When $I_C$ is less than $I_S$, the peak of the transient current waveform $I_G$ coincides with the peak of $I_S$. Because the peak of $I_S$ coincides with the transition time interval of the input voltage, it follows that the peak of $I_C$ precedes the time for the output transition of the logic gate. Conversely, if $I_C$ is greater than Is, the peak of the transient current waveform coincides with the peak of $I_C$. Because the charging current $I_C$ relates to the voltage transition on the output signal line, the peak of $I_G$ is substantially coincident with the time for the output transition of the logic gate.

It will be seen from the equations (1), (2), (3) and (4) that the pulse width of the transient current waveform $I_G$ of the logic gate is proportional to the transition time of the input voltage (for example, the rising transition time $t_r$). Here it is to be noted that because a change in the transition time of the output voltage is sufficiently small relative to a change in a transition time of the input voltage, $I_C$ term appearing in the equation (1) has been neglected.

Integral of transient power supply current

Using the equations (3) and (4), time integrals $Q_{Sr}$ and $Q_{Sf}$ of the short-circuit currents $I_{Sr}$ and $I_{Sf}$ are given as follows:

$$Q_{Sr} = \int_{-\infty}^{\infty} I_{Sr} dt = \frac{I_{Smax}(V_{DD} - V_{THN} - V_{THP})}{2V_{DD}} t_r \tag{6}$$

$$Q_{Sf} = \int_{-\infty}^{\infty} I_{Sf} dt = \frac{I_{Smax}(V_{DD} - V_{THN} - V_{THP})}{2V_{DD}} t_f \tag{7}$$

Accordingly, the integral $Q_S$ of the short-circuit current through the logic gate as it is switched is given as follows:

$$Q_S \equiv \int_{-\infty}^{\infty} I_S dt = \frac{I_{Smax}(V_{DD} - V_{THN} - V_{THP})}{2V_{DD}} t_T \propto t_T \tag{8}$$

where $t_T$ represents a transition time for the input signal. Thus, the integral $Q_S$ of the short-circuit current $I_S$ ($I_{Sr}$ or $I_{Sf}$) which flows into the logic gate is proportional to the time $t_T$ for the input transition of the logic gate. It will also be seen that $Q_S$ does not depend on whether the transition of the input signal is rising or falling.

From the equation (5), it is seen that the integral $Q_C$ of the charging current $I_C$ to an output load capacitance $C_{load}$ of a CMOS inverter is given by the equation indicated below.

$$Q_C = \int_{-\infty}^{\infty} I_C dt = \int_{-\infty}^{\infty} C_{load} \frac{dv_{out}(t)}{dt} dt \tag{9}$$

$$= C_{load}[v_{out}(t)]_{-\infty}^{\infty} = C_{load}(V_{DD} - 0) = C_{load} V_{DD}$$

and it is seen that it does not depend on the time $t_T$ for the input transition of the CMOS inverter.

Consequently, the integrals $Q_{Gf}$ and $Q_{Gr}$ of the transient currents $I_{Gf}$ and $I_{Gr}$ passing through the logic gate are determined from the equations (1), (2), (8) and (9) as follows:

$$Q_{Gf} = \int_{-\infty}^{\infty} (I_{Sf} + I_C) dt = \frac{I_{Smax}(V_{DD} - V_{THN} - V_{THP})}{2V_{DD}} t_T + \tag{10}$$

$$C_{load} V_{DD} \propto t_T$$

$$Q_{Gr} = \int_{-\infty}^{\infty} I_{Sr} dt = \frac{I_{Smax}(V_{DD} - V_{THN} - V_{THP})}{2V_{DD}} t_T \propto t_T \tag{11}$$

Thus, an integral of the transient current through the logic gate is proportional to the time for the input transition of the logic gate.

Transient power supply current $I_{DDI}$ in CMOS integrated circuit

A power supply current in a CMOS integrated circuit represents a power supply current which flows into the CMOS integrated circuit, and is represented by a sum of currents which flow through individual logic gates within the integrated circuit.

A CMOS integrated circuit shown in FIG. 3a comprises a combination of four ($G_1$, $G_2$, $G_3$, $G_4$) of the inverter shown in FIG. 1c and which are connected in tandem. Transient currents $I_{G1}$, $I_{G2}$, $I_{G3}$, $I_{G4}$ which flow through the inverters $G_1$, $G_2$, $G_3$, $G_4$ are normally fed from a single power supply terminal $T_{VD}$. Accordingly, the transient power supply current response of the integrated circuit is represented by a sum of transient currents flowing through the individual logic gates as shown in FIG. 3c and as given below.

$$I_{DDT} = \sum_{n=1}^{N} I_{Gn} \quad (12)$$

where N represents the number of logic gates which are switched by input test pattern sequence. In the example shown in FIG. 3a, N=4. FIG. 3b shows a relationship between an input voltage and an output voltage of each logic gate.

Accordingly, when there is a fault in the integrated circuit which causes a change in the transient current of the logic gate and when there is a test pattern sequence which is capable of activating the fault, the fault can be detected by an observation of $I_{DDT}$ of the integrated circuit.

An integrated value $Q_{DDT}$ of the transient power supply current $I_{DDT}$ can be represented as a sum of integrated values $Q_{Gn}$ (1≦n≦N) of currents which pass through individual logic gates.

$$Q_{DDT} = \int_{-\infty}^{\infty} I_{DDT} dt = \int_{-\infty}^{\infty} \left( \sum_{n=1}^{N} I_{Gn} \right) dt \quad (13)$$

$$= \sum_{n=1}^{N} \int_{-\infty}^{\infty} I_{Gn} dt = \sum_{n=1}^{N} Q_{Gn}$$

In the example of FIG. 3a, the integrated value $Q_{DDT}$ of the transient power supply current $I_{DDT}$ is represented as a sum of integrated values ($Q_{G1}$, $Q_{G2}$, $Q_{G3}$, $Q_{G4}$) of the currents ($I_{G1}$, $I_{G2}$, $I_{G3}$, $I_{G4}$) passing through the individual inverters. Accordingly, if there is a fault within the integrated circuit which causes a transient current through the logic gate or its time integral to change and if there is a test pattern which is capable of activating the fault, the fault can be detected from an observation of the integrated value $Q_{DDT}$ of the transient power supply current $I_{DDT}$ of the integrated circuit.

Detection of gate delay fault

A gate delay fault is a fault which causes a signal propagation delay from an input to an output of a logic gate to increase. A fault which causes a rising transition of an output from the logic gate to retard is referred to as a slow-to-rise fault while a fault which causes a falling transition to retard is referred to as a slow-to-fall fault. When a gate delay fault occurs through a logic gate disposed within a CMOS integrated circuit, the output transition time of the logic gate is retarded. Accordingly, a logic gate which receives at its input an output from the faulty logic gate will have a retarded timing for the peak of the transient current. Accordingly, if a test pattern sequence could activate a faulty logic gate and switch another logic gate which is driven by the faulty gate, the gate delay fault can be detected from an observation of a lag in the current peak of $I_{DDT}$ of the CMOS integrated circuit.

Detection of open fault

Next an open fault which causes a delay fault will be defined. An open fault refers to an unintended electrical discontinuity, specifically indicating that a signal line is divided into two or more distinct signal lines. An open fault includes a breaking as may be caused by a poor contact due to an absence of metal or the presence of an oxide film, a breaking of a metal wiring due to poor patterning or etching, and a breaking in a diffusion layer or a polysilicon due to a mask failure. An open fault can be categorized into two types, including an open fault in which a wiring L is divided in two spaced portions L1 and L2, as shown in FIG. 4a and where an input $V_{IN}$ to one end of the wiring L cannot appear at an output $V_{OUT}$ at the other end of the wiring L to cause a "logic fault" as shown in FIG. 4b, and another open fault in which the divided wiling portions L1 and L2 are spaced very closely as shown in FIG. 4c and where an input signal $V_{IN}$ applied to one end of the wiring L flows as a tunnel current and a transition signal appears at the other end of the wiring L with a delay to cause a "delay fault" as shown in FIG. 4d. An open fault which causes a logic fault involves a large scale of disconnection, so that there is no current flow if a voltage is applied across the signal lines (divided wiring portions L1 and L2) located on the opposite sides of the fault, and accordingly, there takes place no charging or discharge of the parasitic capacitance $C_{load}$ in response to a signal transition, thus causing a logic fault in which the logic is fixed to a given value. By contrast in an open fault which causes a delay fault, a very weak current flows when a voltage is applied across the signal lines (L2 and L2) located on the opposite sides of the fault, but the magnitude of the current is less than a normal current flow, retarding the charging or discharge of the parasitic capacitance $C_{load}$ in response to the signal transition, thus increasing a delay time of the circuit. An open fault which causes a delay fault includes a resistive open fault in which a resistance between signal lines L1 and L2 becomes larger than a normal value as a result of a poor contact or the resistance of the signal line L becomes larger than a normal value as a result of a failure occurring in the signal line L, and a minuscule open fault (<100 nm) in which a very weak leak current flows across two broken signal line portions L1 and L2 by the tunnel effect. A tunnel current through a minuscule open fault is described, for example, in C. L. Henderson, J. M. Soden and C. F. Hawkins, "The Behavior and Testing Implications of CMOS IC Logic Gate Open Circuits" Proceedings of IEEE International Test Conference, pp.302–310, 1991. An open fault which causes a delay fault is dealt with herein and will be simply referred to as an open fault.

With the open fault, there is a small current flow through the fault, and thus it can be modeled by resistive element $R_{open}$ having an increased resistance. FIG. 5a shows an example of a CMOS integrated circuit having an open fault The CMOS integrated circuit comprises a pair of inverters $G_1$, $G_2$, and an open fault exists in a signal line M which connects between the inverters $G_1$ and $G_2$. The location of disconnection can be regarded as being equivalent to a connection through the resistor $R_{open}$. When the inverter $G_1$ switches to produce a signal transition on the signal line M, the presence of the open fault causes a time interval required for an input parasitic capacitor $C_{in}$ of the inverter $G_2$ to be charged or discharged increases (in proportion to the product of the resistance of the open fault and the parasitic capacitance), and accordingly, a signal transition on a signal line M' which is located on the inverter $G_2$ side of the equivalent resistive element $R_{open}$ is retarded as shown in FIG. 5c relative to an output from the inverter $G_1$ (FIG. 5b). Accordingly, as shown in FIG. 6, the transient current waveform (shown in dotted lines) of the inverter $G_2$ having the open fault on its input side has a greater width of the current pulse and a greater time integral of the transient current as compared with the transient current waveform (shown in solid line) of the normal inverter. Accordingly, by observing $I_{DDT}$ or $Q_{DDT}$ of the CMOS integrated circuit the presence of an open fault in the input stage of the inverter $G_2$ can be detected. An open fault which exists on the output stage of the inverter $G_1$ is equivalent to an open fault present on the input stage of the inverter $G_2$, and thus can be similarly detected. For an open fault on any signal line in an integrated circuit generally, if an open fault can be activated by a test pattern sequence to cause a switching of a logic gate which is driven by the activated open fault, such open fault can be detected from an observation of $I_{DDT}$ or $Q_{DDT}$ of the integrated circuit.

Path delay fault

A route within an integrated circuit through which a signal is propagated is referred to as a path. When a delay time from a start point of the path (input signal line) to an end point (output signal line), which is referred to herein as path delay time, becomes greater (or less) than a given value, the integrated circuit exhibits an abnormal behavior, which is referred to as a path delay fault. A path delay fault will now be defined.

Consider that for a CMOS logic circuit that a path $P=\{g_0, g_1 \ldots , g_m\}$ is activated using a test pattern sequence $T=<v_1,v_2>$ meaning that it contains two test patterns $v_1$ and $v_2$ and that a voltage signal $v_2$ follows a voltage signal $v_1$. $g_0$ represents an input signal line of the path P while $g_1$, $g_2, \ldots, g_m$ represent output signal lines of logic gates $G_1$, $G_2, \ldots, G_m$ on the path P. At the same time, $g_0, g_1, \ldots, g_{m-1}$ represent input signal lines to the logic gates $G_1, G_2, \ldots, G_m$ on the path P. Denoting the time for a signal transition on each signal line $g_0, g_1, \ldots , g_m$ (the time when the voltage signal passes $V_{DD}/2$) by $\tau_0, \tau_1, \ldots \tau_m$, the gate delay time $t_{gdt}$ ($1 \leq i \leq m$) of the respective logic gates $G_1, G_2, \ldots , G_m$ on the path P is given as follows:

$$t_{gdi}=\tau_1-\tau_{1-l} \tag{14}$$

Accordingly, the path delay time $t_{pd}$ of the path P is given as a sum of the gate delay times $t_{gdi}$, as follows:

$$t_{pd} = \sum_{i=1}^{m} t_{gdi} = \tau_m - \tau_0 \tag{15}$$

However, the actual gate delay time $t_{gdt}$ varies under the influence of a fault as follows:

$$t_{gdi}=t_{gdt,typ}\delta_1, 1 \leq i \leq m \tag{16}$$

where $t_{gdt,typ}$ represents a typical value of the gate delay time of the logic gate $G_i$, and $\delta_i$ represents a variation component in the gate delay time. For example, a breaking fault causes the gate delay time of only a faulty logic gate to increase without increasing the delay time of other logic gates. A parametric fault causes the delay time of every logic gate to increase. With the variation in the gate delay time, the path delay time $t_{pd}$ similarly varies as indicated by an equation given below.

$$t_{pd} = t_{pd,typ} + \Delta = \sum_{i=1}^{m} (t_{gdi,typ} + \delta_i) \tag{17}$$

where $t_{pd,typ}$ represents a typical value of a path delay time for the path P and $\Delta$ represents a variation component in the path delay time.

FIG. 7 is a schematic illustration of the fundamental principle of a delay fault testing technique. In order for a semiconductor integrated circuit (DUT) under test shown in FIG. 7a to operate normally, a signal transition which occurs in an input latch must pass through a path P in the semiconductor integrated circuit under test to be transmitted to an output latch in a given time interval. Accordingly, it will be seen from the relationship between an input $V_{IN}$ and an output $V_{OUT}$ and their relationship with respect to a system clock as shown in FIG. 7b, that the path delay time $t_{pd}$ of the path P must satisfy the following requirement:

$$t_{pd}+T_{SU}<T_{CLK}-T_{SKW} \tag{18}$$

where $T_{SU}$ represents a set-up time for the signal, $T_{CLK}$ the period of the system clock and $T_{SKW}$ a clock skew of the system clock. The clock skew $T_{SKW}$ is a jitter of the system clock and represents an amount by which the edge of the system clock changes in the positive or negative direction. The equation (18) can be modified as follows:

$$t_{pd}<T_{CLK}-T_{SKW}-T_{SU}=T' \tag{19}$$

Thus, the path delay time $t_{pd}$ of the path P must be less than a time interval T' which results when margins such as the set-at time $T_{SU}$ and the clock skew $T_{SKW}$ are subtracted from the clock period $T_{CLK}$. If $t_{pd}$ is greater than T', the signal transmission along the path P cannot catch up with the system clock, and the circuit cannot operate properly. This condition is defined as a delay fault. In other words, the path P is defined as having a delay fault when $t_{pd}$ is greater than a given time interval T'. T' represents an upper limit of a permissible delay time.

Detection of path delay (utilizing a pulse width of transient power supply current)

Since the peak or the falling edge of the transient current waveform of the logic gate corresponds to the time for the output transition of the logic gate, it follows that the last peak (or the last falling edge) of the transient power supply current waveform of the CMOS integrated circuit coincides with the time of the output transition of the logic gate which is the last to be switched in the CMOS integrated circuit Accordingly, by detecting the last peak (or the last falling edge) of the transient power supply current waveform of the CMOS integrated circuit, and comparing the time of detection against the time for the input transition, a path delay time for the integrated circuit can be determined. The time for the last falling edge of the transient power supply current can be determined as a maximum value of the time when the transient power supply current assumes a given current value, for example, from the time for the input transition on the path of the integrated circuit. This current value represents a value of the power supply current when the output voltage from the last logic gate on the path under test reaches a value equal to one-half the supply voltage $V_{DD}$, and can be determined by the circuit simulation of the circuit under test or from statistical data obtained with an actual device.

A path delay fault on the path under test can be detected by comparing the determined path delay time against a given time (such as a period $T_{CLK}$ of a system clock, for example).

A technique for detecting a delay fault utilizing the pulse width of a transient power supply current mentioned above will now be described. According to this technique, the pulse width of the power supply current waveform of a circuit under test is measured and compared against a given time interval. The fundamental principle of the technique is illustrated in FIG. 8.

Assume that in a CMOS logic circuit, a plurality of paths $P_1, P_2, \ldots , P_n$ are activated using test pattern sequence $T=<v_1, v_2>$ including two test patterns $v_1, v_2$. Denoting the time when a j-th logic gate, as counted from the input of a path $P_i$, is switched by $\tau_{ij}$, it will be noted that the number of logic gates depends on each of the paths $P_1, P_2, \ldots, P_n$, and the time $\tau_{max}$ for the output transition of a logic gate $G_{final}$ which is the last to be switched among the paths $P_1$, $P_2, \ldots, P_n$ is given by the following equation:

$$\tau_{max} = \max_{i,j}\{\tau_{ij}\}, 1 \le i \le n, 1 \le j \quad (20)$$

Thus, a maximum value of path delay time $t_{pd.max}$ among the paths $P_1, P_2, \ldots, P_n$ is determined as a time interval between $\tau_{max}$ and time $\tau_0$ for the input transition, as indicated below.

$$t_{pd.max} = \tau_{max} - \tau_0 \quad (21)$$

On the other hand, the pulse width $t_{PW}$ of the transient power supply current waveform of the CMOS logic circuit is defined as a time interval between the time $\tau_0$ for the signal transition of the circuit input and the $\tau_{IDD}$ of the last peak (falling edge) of the transient power supply current waveform. Thus $$t_{PW} = \tau_{IDD} - \tau_0 \quad (22)$$

As mentioned previously, the time $\tau_{IDD}$ for the last peak of the transient power supply current waveform either coincides with the time $\tau_{max}$ for the output transition of the logic gate $G_{final}$ which is the last to be switched or precedes $\tau_{max}$. Thus, the pulse width $t_{PW}$ of the transient power supply current waveform corresponds to the delay time $t_{pd.max}$ of the path P which is activated by a test pattern T.

$$t_{PW} = \tau_{IDD} - \tau_0 \le \tau_{max} - \tau_0 = t_{pd.max} \quad (23)$$

If $t_{PW}$ is greater than the upper limit T' of the permissible delay time, it follows that $$T' < t_{PW} \le t_{pd\ max} \quad (24)$$

Thus, the signal transmission cannot catch up with the system clock on the path having the greatest delay time $t_{pd.max}$. Thus, there exists a delay fault in the circuit. In this manner, $t_{PW}$ greater than T' indicates the presence of a delay fault on some one of the activated paths, while $t_{PW}$ less than T' indicates the absence of a delay fault on any activated path.

$t_{PW} \le T'$ no delay fault $t_{PW} > T'$ delay fault present (25)

In this manner, a delay fault in the circuit can be tested by comparing the pulse width $t_{PW}$ of the transient power supply current waveform against a given time T'.

Delay fault detecting technique (utilizing the instantaneous value of the transient power supply current)

Because the transient power supply current of a logic gate decreases monotonously after its peak as shown in FIG. 1b, it will be seen that the power supply current of the CMOS integrated circuit shown in FIG. 3c decreases monotonously subsequent to the time for the output transition of a logic gate which is the last to be switched in the integrated circuit. In other words, in a fault-free CMOS integrated circuit, denoting the time for the output transition of the last logic gate to be switched by $\tau_{max}$ and the instantaneous value of the transient power supply current at time $\tau_{max}$ by I', the transient power supply current of the CMOS integrated circuit cannot become greater than I' subsequent to $\tau_{max}$.

Using this principle, a path delay fault in a circuit under test can be detected by measuring the instantaneous value of a transient power supply current of a CMOS integrated circuit at a given time. The current value I' which is used as a criterion for the judgment of a fault detection is a value of the power supply current at the time when an output from the last logic gate on a path under test assumes one-half the supply voltage, and can be determined by a circuit simulation of the circuit under test or from statistical data using an actual device.

A technique for detecting a delay fault utilizing the instantaneous value of the transient power supply current will be described. According to this technique, the instantaneous value of the transient power supply current of the circuit under test at a given time is measured, and is compared against the value of the transient power supply current of a golden circuit which is free from a delay fault. The fundamental principle of the technique is illustrated in FIG. 9.

Assume that in a CMOS logic circuit, a plurality of paths $P_1, P_2, \ldots, P_n$ are activated by test pattern sequence $T = <v_1, v_2>$. Denoting the time when a j-th logic gate as counted from the input of a path $P_i$ by $\tau_{ij}$, the time $\tau_{max}$ for the output transition of a logic gate $G_{final}$ which is the last to be switched among the paths $P_1, P_2, \ldots, P_n$ is given by the following equation:

$$\tau_{max} = \max_{i,j}\{\tau_{ij}\}, 1 \le i \le n, 1 \le j \quad (26)$$

Accordingly, a maximum value $t_{pd.max}$ of the path delay time among the paths $P_1, P_2, \ldots, P_n$ can be determined as a time interval between $\tau_{max}$ and a time $\tau_0$ for the input transition, as indicated below.

$$t_{pd\ max} = \tau_{max} - \tau_0 \quad (27)$$

As mentioned previously, because the time for the output transition of a logic gate coincides with the time for the peak or the falling edge of the transient power supply current of the logic gate, it follows that $\tau_{max}$ corresponds to a time $\tau_{IDD}$ for the last peak or the falling edge of the transient power supply current waveform $I_{DDT}$ of the circuit. The power supply current $I_G$ of the logic gate can be approximated by a triangular wave and $G_{final}$ represents the last gate to be switched, and hence, there is no logic circuit which has a peak of the power supply current subsequent to $\tau_{max}$. Accordingly, a power supply current waveform function $i_{DDT}(t)$ is a monotonously decreasing function at time t which is $t \ge \tau_{max}$. Thus, denoting the time function for the power supply current waveform by $i_{DDT}(t)$ and the instantaneous value of the power supply current at a time $\tau_{max}$ by I', the latter is given as follows:

$$I' = i_{DDT}(\tau_{max}) \quad (28)$$

It follows that at time t which is $t \ge \tau_{max}$, $$i_{DDT}(t) \le i_{DDT}(\tau_{max}) = I', t \ge \tau_{max} \quad (29)$$

In order for the circuit to operate properly, $t_{pd.max}$ must be less than the upper limit T' of the delay time (which is equal to $T_{CLK}-T_{SKEW}=T_{SU}$ as indicated in the equation (19). Thus $$t_{pd.max}=\tau_{max}-\tau_0<T' \tag{30}$$

Accordingly, in the absence of a fault in the circuit, it follows from the equation (29) that at time t which is $t=T'+\tau_0>\tau_{max}$ $$i_{DDT}(T'+\tau_0) \leq I' \tag{31}$$

If the instantaneous value of $I_{DDT}$ at $T'+\tau_0$ is greater than I' or $$i_{DDT}(T'+\tau_0)>I'=i_{DDT}(\tau_{max}) \tag{32}$$

it follows from the equation (29) that because $T'+\tau_0$ cannot be greater than $\tau_{max}$ $$\tau_{max}>T'+\tau_0 \tag{33}$$

$$t_{pd.max}=\tau_{max}-\tau_0>T' \tag{34}$$

This means that on a path having the greatest delay time $t_{pd.max}$, the signal transmission cannot catch up with the system clock. Thus the presence of a delay fault in the circuit is indicated. In is manner, the fact that a value of the transient power supply current $I_{DDT}(T'+\tau_0)$ at time $T'+\tau_0$ is greater than I' indicates the presence of a delay fault in one of the activated paths. Conversely, the fact that $i_{DDT}(T'+\tau_0)$ is less than I' indicates the absence of a delay fault on any activated path.

$$i_{DDT}(T'+\tau_0) \leq I' \text{ no delay fault}$$

$$i_{DDT}(T'+\tau_0)>I' \text{ delay fault present} \tag{35}$$

As discussed above, a delay fault in the circuit can be detected by comparing the instantaneous value of $I_{DDT}$ at a given time against $I_{DDT}$ level of a fault-free circuit.
Detection of path delay fault (utilizing a time integral of transient power supply current In addition, by using the integrated value $Q_{DDT}$ of the transient power supply current $I_{DDT}$, a path delay fault which is caused by an open fault can be detected. A technique for detecting a path delay fault by utilizing an integrated value of the transient power supply current will now be described. According to this technique, an integrated value of a transient power supply current through a circuit under test is measured, and is compared against a given value to evaluate a path delay fault.

The integrated value $Q_{DDT}$ of the transient power supply current $I_{DDT}$ is represented as a sum of integrated values $Q_{Gn}(1 \leq n \leq N)$ of currents passing through individual logic gates.

$$Q_{DDT} = \int_{-\infty}^{\infty} I_{DDT} dt = \int_{-\infty}^{\infty} \left( \sum_{n=1}^{N} I_{Gn} \right) dt \tag{13}$$

$$= \sum_{n=1}^{N} \int_{-\infty}^{\infty} I_{Gn} dt = \sum_{n=1}^{N} Q_{Gn}$$

Since the integral $Q_{Gn}$ ($1 \leq n \leq N$) of the current passing through each logic gate is proportional to the time $t_{Tn}$ ($1 \leq n \leq N$) for the input transition of each logic gate, as indicated by the equation (10) or (11), $Q_{DDT}$ is given by a linear polynomial of $t_{Tn}$ ($1 \leq n \leq N$). In the example shown in FIG. 3a, $Q_{DDT}$ is given by a linear polynomial 36, indicated below of the times ($t_{T1},t_{T2},t_{T3},t_{T4}$) for the input transitions of the respective inverters ($G_1,G_2,G_3,G_4$).

$$Q_{DDT} = \sum_{n=1}^{N} Q_{Gn} = \sum_{n=1}^{N} Q_{Sn} + \sum_{n=1}^{N} Q_{Cn} = \sum_{n=1}^{N} a_n t_{Tn} + b \tag{36}$$

In the equation (36), an represents a factor of proportionality between the integral $Q_{Sn}$ of the short-circuit current through the logic gate $G_n$ and the time $t_{Tn}$ for the input transition of the logic gate $G_n$, and b a constant term which is represented by a sum of charging currents $Q_{Cn}$ which flow into the respective logic gates.

An open fault can be modeled by a large resistance $R_{open}$ since a very weak current flows through the fault. FIG. 10a shows an example of CMOS inverter having an open fault at its input. When a signal transition as shown in FIG. 10b occurs on an input signal line A, a signal transition occurring on an signal line A' which is located subsequent to the location of the fault is retarded due to the open fault as indicated in FIG. 10c. At this time, denoting the resistance of the open fault by $R_{open}$ and the parasitic capacitance at the input of the inverter by $C_{in}$, the time interval $t_T$ for the signal transition on the signal line A' is given as indicated below $$t_T \approx t_{T,typ}+2.2R_{open}C_{in} \tag{37}$$

where $t_{T,typ}$ represents a typical value of the transition time for the input signal when there is no fault. The transition time $t_T$ is determined here as a time interval for the voltage to rise from $0.1 V_{DD}$ to $0.9 V_{DD}$ (or to fall from $0.9 V_{DD}$ to $0.1 V_{DD}$) $2.2 R_{open} C_{in}$ represents a time interval in order for a voltage across $C_{in}$ rises from $0.1 V_{DD}$ to $0.9 V_{DD}$, and is determined from $\log_e (0.9 V_{DD}/0.1 V_{DD}) \times R_{open} C_{in}$. Thus, an increment in the transition time for the input signal of the inverter is proportional to the resistance $R_{open}$ of the open fault. Accordingly, when there is an open fault on the input of a k-th inverter on the path under test the integral $Q_{DDT}$ of the power supply current of the CMOS integrated circuit is determined from the equations (36) and (37) as indicated by an equation (38). Thus, $Q_{DDT}$ linearly changes in accordance with the resistance $R_{open}$ of the open fault and the increment is proportional to the resistance $R_{open}$ of the open fault.

$$Q_{DDT} = \sum_{n=1}^{N} a_n t_{Tn} + b = \left( \sum_{n=1}^{N} a_n t_{Tn,typ} + b \right) + 2.2 a_k C_{in} R_{open} \tag{38}$$

$$= Q_{DDT,typ} + 2.2 a_k C_{in} R_{open} \propto R_{open}$$

where $Q_{DDT,typ}$ represents a typical value of the integral of the power supply current when there is no fault. $2.2 a_k C_{in} R_{open}$ appearing as a second term on the right hand side of the equation (38) is an addition which is based on the input open fault of the k-th inverter. The equation (38) shows a coincidence with a result of simulation performed on a change in $Q_{DDT}$ with respect to $R_{open}$ as shown in FIG. 11. FIG. 11 is a plot of a change in $Q_{DDT}$ with respect to the resistance $R_{open}$ of the open fault when there is an open fault in the input signal line IN2 of the inverter $G_2$ in the circuit shown in FIG. 3.

A gate delay time $t_{gd}$ of a logic gate is proportional to the time $t_T$ for the transition of an input signal as indicated by an equation (39) below. ( see equations 4.52 and 4.53, "Principles of CMOS VLSI Design-A Systems Perspective", Second Edition, Addison-Weely Publishing Company, issued 1999, pp. 216–217)

$$t_{gd} = t_{gd,step} + \frac{1}{6}\left(1 - 2\frac{V_{TH}}{V_{DD}}\right)t_T \quad (39)$$

where $t_{gd,step}$ represents a delay time of a fault free inverter with respect to a step input at transition time 0, and $V_{TH}$ a threshold voltage for PMOS or n-MOS, it being understood that $V_{TH}=V_{THN}$ for a rising transition of an input, and $V_{TH}=V_{THP}$ for a falling transition of an input. Accordingly, since a gate delay time $t_{gd}$ of a logic gate having an open fault which can be modeled by a resistance $R_{open}$ on an input signal line is given by the equation (37), it can be determined by substitution of the equation (37) into the equation (39), as indicated below.

$$\begin{aligned}
t_{gd} &= t_{gd,step} + \frac{t_T}{6}\left(1 - 2\frac{V_{TH}}{V_{DD}}\right) \quad (40)\\
&= t_{gd,step} + \frac{t_{T,typ} + 2.2R_{open}C_{in}}{6}\left(1 - 2\frac{V_{TH}}{V_{DD}}\right)\\
&= t_{gd,step} + \frac{t_{T,typ}}{6}\left(1 - 2\frac{V_{TH}}{V_{DD}}\right) + \frac{2.2C_{in}}{6}\left(1 - 2\frac{V_{TH}}{V_{DD}}\right)R_{open}\\
&= t_{gd,typ} + \frac{2.2C_{in}}{6}\left(1 - 2\frac{V_{TH}}{V_{DD}}\right)R_{open} \propto R_{open}
\end{aligned}$$

where $t_{gd,typ}$ is a typical value of the gate delay time of a fault-free logic gate. Specifically, the gate delay time $t_{gd}$ of a logic gate having an open fault varies depending on the resistance $R_{open}$ of the fault, and the increment δ of the gate delay time is proportional to the resistance $R_{open}$ of the fault. Consequently, when there is a braking fault on the input of any logic gate on the path under test, the path delay time $t_{pd}$ of the path under test is also proportional to $R_{open}$. This is indicated by an equation (41) given below which is obtained by the substitution of the equation (40) into the equation (17).

$$\begin{aligned}
t_{pd} &= \sum_{i=1}^{m} t_{gdi} \quad (41)\\
&= \sum_{i=1}^{m} t_{gdi,typ} + \frac{2.2C_{ink}}{6}\left(1 - 2\frac{V_{TH}}{V_{DD}}\right)R_{open}\\
&= t_{pd,typ} + \frac{2.2C_{ink}}{6}\left(1 - 2\frac{V_{TH}}{V_{DD}}\right)R_{open} \propto R_{open}
\end{aligned}$$

This agrees with the result of simulation conducted on a change of $t_{pd}$ with respect to $R_{open}$ as indicated in FIG. 12, which is a plot of a change of $t_{pd}$ with respect to the resistance $R_{open}$ of an open fault when there is an open fault in the input signal line IN2 of an inverter $G_2$ in the circuit shown in FIG. 3a.

When an open fault exist on the input of a logic gate $G_k$ on the path P, the integral $Q_{Sk}$ of the short-circuit current of the gate $G_k$ is determined from the equations (8) and (37) as given below $$\begin{aligned}
Q_{Sk} &= \frac{I_{Smax}(V_{DD} - V_{THN} - V_{THP})}{2V_{DD}}t_{Tk}\\
&= \frac{I_{Smax}(V_{DD} - V_{THN} - V_{THP})}{2V_{DD}}(t_{Tk,typ} + 2.2R_{open}C_{ink})
\end{aligned}$$

-continued
$$\begin{aligned}
&= \frac{I_{Smax}(V_{DD} - V_{THN} - V_{THP})}{2V_{DD}} \cdot t_{Tk,typ} +\\
&\quad \frac{I_{Smax}(V_{DD} - V_{THN} - V_{THP})}{2V_{DD}} \cdot 2.2R_{open}C_{ink}\\
&= Q_{Sk,typ} + \frac{2.2I_{Smax}(V_{DD} - V_{THN} - V_{THP})C_{ink}}{2V_{DD}} \cdot R_{open}
\end{aligned}$$

Accordingly, the integral $Q_{DDT}$ of the transient power supply current of the integrated circuit is determined according to the equation (36) as given below.

$$\begin{aligned}
Q_{DDT} &= \sum_{n=1}^{N} Q_{Gn} \quad (42)\\
&= \sum_{n=1}^{N} Q_{Sn} + \sum_{n=1}^{N} Q_{Cn}\\
&= \sum_{n=k}^{N} Q_{Sn,typ} + Q_{Sk,typ} +\\
&\quad \frac{2.2I_{Smax}(V_{DD} - V_{THN} - V_{THP})C_{ink}}{2V_{DD}} \cdot R_{open} + \sum_{n=k}^{N} Q_{Cn}\\
&= \sum_{n=1}^{N} Q_{Sn,typ} + \sum_{n=1}^{N} Q_{Cn} +\\
&\quad \frac{2.2I_{Smax}(V_{DD} - V_{THN} - V_{THP})C_{ink}}{2V_{DD}} \cdot R_{open}\\
&= Q_{DDT,typ} + \frac{2.2I_{Smax}(V_{DD} - V_{THN} - V_{THP})C_{ink}}{2V_{DD}} \cdot R_{open}
\end{aligned}$$

Thus, the integral $Q_{DDT}$ of the transient power supply current of the integrated circuit is also proportional to the resistance $R_{open}$ of the open fault.

Thus, it will be seen from the equations (41) and (42) that the delay time $t_{pd}$ of the path P having an open fault changes linearly with respect to the integral $Q_{DDT}$ of the transient power supply current of the CMOS integrated circuit, and this agrees with the result of a simulation conducted on the change of $t_{pd}$ with respect to $Q_{DDT}$ as indicated in FIG. 13, which is a plot of a change $t_{pd}$ with respect to the integral $Q_{DDT}$ of the transient power supply current when an open fault is present on the input signal line IN2 of an inverter $G_2$ in the circuit shown in FIG. 3a.

The substitution of $R_{open}$ which is determined from the equation (42) into the equation (41) yields an equation (43).

$$\begin{aligned}
t_{pd} &= t_{pd,typ} + \frac{2.2C_{ink}}{6}\left(1 - 2\frac{V_{TH}}{V_{DD}}\right)R_{open} \quad (43)\\
&= t_{pd,typ} + \frac{2.2C_{ink}}{6}\left(1 - 2\frac{V_{TH}}{V_{DD}}\right) \cdot\\
&\quad \frac{(Q_{DDT} - Q_{DDT,typ}) \cdot 2V_{DD}}{2.2I_{Smax}(V_{DD} - V_{THN} - V_{THP})C_{ink}}\\
&= t_{pd,typ} + \frac{V_{DD} - 2V_{TH}}{3I_{Smax}(V_{DD} - V_{THN} - V_{THP})}(Q_{DDT} - Q_{DDT,typ})
\end{aligned}$$

Denoting the integral of the transient power supply current when the path delay time $t_{pd}$ is equal to the upper limit T' of the permissible delay time by $Q_{max}$, an equation (44), given below, is obtained by solving the equation (43) for $Q_{max}$ by putting $t_{pd}=T'$ and $Q_{DDT}=Q_{max}$.

$$Q_{max} = Q_{DDT,typ} + \frac{3I_{Smax}(V_{DD}-V_{THN}-V_{THP})}{V_{DD}-2V_{TH}}(T'-t_{pd,typ}) \quad (44)$$

The $Q_{max}$ represents the upper limit of the integral $Q_{DDT}$ of the transient power supply current of the CMOS integrated circuit which is free from a delay fault. Thus it can be determined that there is no path delay fault in the CMOS integrated circuit when $Q_{DDT}$ is less than $Q_{max}$ while there exists a path delay fault due to a break fault in the CMOS integrated circuit when $Q_{DDT}$ is greater than $Q_{max}$.

$Q_{DDT} \leq Q_{max}$ no delay fault $Q_{DDT} > Q_{max}$ delay fault present (45)

As discussed above, by comparing the integral $Q_{DDT}$ of the transient power supply current against the given value $Q_{max}$, a delay fault in the circuit can be tested The given value $Q_{max}$ can be determined by a circuit simulation or from the equation (45) using statistical data.

Features of a delay fault test by way of the transient power supply current

The transient power supply current is a transient current which flows through a power supply pin of an integrated circuit, and a higher observability is assured for this transient current than for a voltage signal. Accordingly, a delay fault testing method which employs the transient power supply current is capable of assuring a high observability of a delay fault than with a delay fault testing technique which employs a voltage signal. By way of example, a delay fault testing technique which employs a voltage signal can not detect a delay fault unless the voltage signal is transmitted to an output signal line of an integrated circuit. By contrast with a delay fault testing technique which employs a transient power supply current signal, a transient power supply current signal having a pulse width which corresponds to a delay time on a path on which the voltage signal is transmitted is observable if the voltage signal is not transmitted to an output signal line of the integrated circuit, and thus is capable of detecting a delay fault. Concomitantly, there is no need to transmit a voltage signal to an output signal line of an integrated circuit with the delay fault testing technique which employs the transient power supply current signal and accordingly, limitations imposed upon generating test patterns are reduced with this technique in comparison to the generation of test patterns for a conventional delay fault testing technique which employs a voltage signal where it is necessary to transmit the voltage signal to the output signal line of the integrated circuit. This allows the generation of test patterns to be facilitated. In extreme cases, if test pattern sequence are selected at random, the delay fault testing technique which employs the transient power supply current signal is capable of detecting a delay fault on a path which is activated by selected test pattern sequence.

Fault simulation method (for gate delay fault)

The fault simulation method according to the present invention which prepares a fault list in unit of a gate delay fault will now be described. FIG. 14 shows an example of a MOS integrated circuit under test. The integrated circuit under test includes four input terminals $x_1$, $x_2$, $x_3$, $x_4$, two output terminals $z_1$, $z_2$, five internal signal nodes $n_1$, $n_2$, $n_3$, $n_4$, $n_5$, five logic gates $G_1$, $G_2$, $G_3$, $G_4$, $G_5$ and output buffers $G_6$, $G_7$. Input terminals $x_1$ and $x_2$ are connected to two inputs of NAND gate $G_1$, the output of which is connected through the signal node $n_1$, to the input of the inverter gate $G_2$ and to one input of OR gate $G_3$. The output from the inverter gate $G_2$ is connected through the node $n_2$ to one input of AND gate $G_4$, and the output from the gate $G_3$ is connected through the node $n_3$ to the other input of AND gate $G_4$ and to one input of AND gate $G_5$. The input terminal $x_3$ is connected to the other input of OR gate $G_3$, and the input terminal $x_4$ is connected to the other input of AND gate $G_5$. Outputs from AND gates $G_4$ and $G_5$ are connected through the nodes $n_4$ and $n_5$, respectively, and further through the output buffers $G_6$, $G_7$ to the output terminals $z_1$ and $z_2$, respectively. The power supply terminals of the gates $G_1$ to $G_7$ are connected to a common power supply, while this is not shown.

Here it is assumed that the gates $G_1$, $G_2$, $G_3$, $G_4$, $G_5$, $G_6$ and $G_7$ have gate delays (propagation delays) equal to 1, 1, 3, 2, 1, 1 and 1, respectively. An example of results of a fault simulation which is performed upon the MOS integrated circuit under test is illustrated in FIG. 15. In FIG. 15, the first column, as counted from the left, represents an identifier of a test pattern sequence; the second column shows input signals applied to the input terminals $x_1$, $x_2$, $x_3$, $x_4$ of the CMOS integrated circuit under test; the third column shows a train of transition signal values which appear on the internal signal nodes $n_1$, $n_2$, $n_3$, $n_4$, $n$, of the CMOS integrated circuit under test when each test pattern sequence is applied to the input terminals $x_1$, $x_2$, $x_3$, $x_4$; and the fourth column shows a train of transition signal values which occur on the output terminals $z_1$, $z_2$ of the CMOS integrated circuit under test which result from the transition signal values on these nodes. Signals "L", "H", "R", and "F" entered in the second, the third and the fourth column in FIG. 15 represent a normally low level signal <"0", "0"> (it being understood that a first element within <> represents an initial signal value and a second element represents a final signal value), a normally high level signal <"1","1">, a signal which rises from a low level to a high level <"0", "1"> and a signal which falls from a high level to a low level <"1", "0">, respectively.

Thus each test pattern sequence comprises two test patterns. For example, a test pattern sequence T1="LLR" signifies that $x_1$, $x_2$, $x_3$=<"000", "001">. Numerals entered in parentheses below corresponding signal values represent a transition time of each signal as referenced to the transition time of the signal at the input terminal which is chosen to be 0. For example, R(3) indicates the occurrence of a rising transition signal ("R") at time 3.

The fifth column in FIG. 15 shows a set of delay faults which can be detected during the transient power supply current testing or a fault list when each test pattern sequence is applied to the integrated circuit under test. When a logic gate has a gate delay fault, the output transition time of the logic gate is retarded. Concomitantly, a logic gate which is connected at its input to the output of this faulty logic gate has the timing of a peak of its transient current retarded, whereby the transient power supply current of the integrated circuit under test exhibits an abnormality. In this manner, from an observation to see whether or not an abnormality occurs in the transient power supply current when a test pattern sequence is applied, it is possible to determine whether or not a logic gate which undergoes a switching operation (either a rising or falling transition) in response to the input test pattern sequence is faulty as a logic gate which is connected at its input to the output signal line from the first mentioned logic gate undergoes a switching operation.

By way of example, when a test pattern sequence T2 shown in FIG. 15 is applied to the CMOS integrated circuit under test shown in FIG. 14, there occurs a transition signal F(1) at an output node $n_1$, of a logic gate $G_1$ in the CMOS integrated circuit under test, as shown in FIG. 16. Similarly, transition signals R(2), and F(4) occur at output nodes $n_2$ and $n_3$ of logic gates $G_2$ and $G_3$, respectively. As a result of the transition signal R(2) occurring at the node $n_2$ and the transition signal F(4) occurring at the node $n_3$, there occur at the output node $n_4$ of the logic gate $G_4$ a rising transition R at time 4 and a failing transition F at time 6. Thus, the transition signals R(4)–F(6) occur at the node $n_4$. Similarly, the transition signals R(5)–F(7) occur at the output terminal $z_1$ of the output buffer $G_6$. Accordingly, when there exists a slow-to-fall fault in either one of the logic gates $G_1$, $G_3$ and $G_4$ or when there is a slow-to-rise fault in the logic gate $G_2$ or $G_4$, an abnormality in the transient power supply current is observed during the transient power supply current testing which uses the test pattern sequence T2. In other words, the transient power supply current testing which uses the test pattern sequence T2 allows a slow-to-fall fault in either one of the logic gates $G_1$, $G_3$ and $G_4$ and a slow-to-rise fault in either logic gate $G_2$ or $G_4$ to be detected. Thus, a fault list which is determined by the test pattern sequence T2 can be determined as $\{G_1F, G_3F, G_4F, G_2R, G_4R\}$ from the described $I_{DDT}$ fault simulation, as indicated in the row of test pattern sequence T2 in FIG. 15. It will be understood that "F" and "R" in the fault list represent a slow-to-fall fault and a slow-to-rise fault, respectively.

It will be understood from the foregoing that a fault list, in unit of a gate delay fault which are detectable with a test pattern sequence can be prepared.

$I_{DDT}$ fault simulation method (for open faults)

$I_{DDT}$ fault simulation method which prepares a fault list in unit of a open fault will now be described. FIG. 17 shows CMOS integrated circuit under test. This circuit is the same as shown in FIG. 14, but signal lines connecting between input terminals $x_1$, $x_2$, $x_3$, $x_4$ and logic gates as well as signal lines connecting between logic gates are designated by signal lines $m_1, m_2, \ldots, m_{13}$. It is understood that the signal lines include input and output signal lines as well, and a branch signal line is treated as a distinct signal line. Output signal lines $m_{12}$ and $m_{13}$ are connected to output buffers $G_6$, $G_7$, respectively.

An example of results of $I_{DDT}$ fault simulation which is performed upon the CMOS integrated circuit under test is illustrated in FIG. 18. In FIG. 18, the first column, as counted from the left, represents an identifier for a test pattern sequence; the second column show input signals applied to the input terminals $x_1$, $x_2$, $x_3$, $x_4$ of the CMOS integrated circuit under test; the third column show signals occurring on signal lines $m_1, m_2, \ldots, m_{13}$ of the CMOS integrated circuit under test when each test pattern sequence is applied thereto; and the fourth column show signals appearing on the output terminals $z_1$, $z_2$ of the CMOS integrated circuit under test when each test pattern sequence is applied thereto. Signals "L", "H", "R" and "F" remain the same as described above in connection with FIG. 15. For example, a test pattern sequence T="RLLL" signifies that $x_1,x_2,x_3,x_4$=<"0000", "1000">. The fifth column in FIG. 18 show a set of signal lines having open faults which are detectable by the transient power supply current testing when each test pattern sequence is applied to the CMOS integrated circuit under test, or a fault list. When a signal line in the integrated circuit has an open fault, the switching operation of a logic gate which is connected at its input to the faulty signal fine will be retarded, accompanying a change in the transient power supply current waveform of the logic circuit and thus exhibiting an abnormality in the transient power supply current of the integrated circuit under test. Accordingly, from an observation to see whether or not an abnormality occurs in the transient power supply current when a test pattern sequence is applied, it is possible to determine whether or not a signal line which undergoes a switching operation in response to the input test pattern sequence is faulty when a logic gate which is connected at its input to the faulty signal fine undergoes a switching operation.

By way of example, when a test pattern sequence T2 shown in FIG. 18 is applied to a CMOS integrated circuit under test shown in FIG. 17, a transition signal F(0) occurs on a signal lines $m_1$ in the CMOS integrated circuit under test, and transition signals F(1), F(1) and F(1) occur on signal lines $m_5$, $m_6$ and $m_7$, respectively, as shown in FIG. 19. Similarly, transition signals R(2), F(4), F(4), F(4), and R(4)–F(6) occur on signal lines $m_8$, $m_9$, $m_{10}$, $m_{11}$ and $m_{12}$, respectively, and transition signals R(5)–F(7) occur on the output terminal $z_1$. A transition signal F(4) occurs on the signal line $m_{11}$, but there occurs no transition in the output of the logic gate $G_5$ which is connected at its input to the signal line $m_{11}$. Accordingly, whenever there is an open fault in either one of the signal lines $m_1$, $m_5$, $m_6$, $m_7$, $m_8$, $m_9$, $m_{10}$ and $m_{12}$, there occurs a transition in the output of a logic gate which is connected at its input to such signal line. Accordingly, an abnormality in the transient power supply current is observed during the transient power supply current testing which uses the test pattern sequence T2 if an open fault exists on one of these signal lines. In other words, the transient power supply current testing which uses the test pattern sequence T2 allows the presence of an open fault on the signal lines $m_1$, $m_5$, $m_6$, $m_7$, $m_8$, $m_9$ $m_{10}$ and $m_{12}$ to be detected. Thus, a fault list which is obtained with the test pattern sequence T2 is determined by the described $I_{DDT}$ fault simulation to be $\{m_1, m_5, m_6, m_7, m_8, m_9, m_{10}, m_{12}\}$, as indicated in the row of the test pattern sequence T2 in FIG. 18. The list of open faults is indicated in terms of signal lines on which an open fault is likely to occur.

It will be understood from the foregoing that a fault list, in unit of an open fault, which are detectable with a test pattern sequence can be prepared. $I_{DDT}$ fault simulation method mentioned above is not limited to the detection of open faults on signal lines which connect between logic gates, but is equally applicable to open faults on signal lines which are located within logic gates, by assuming the presence of a fault on a signal line within a logic gate.

$I_{DDT}$ fault simulation method (for path delay faults)

The fault simulation method according to the present invention which prepares a fault list in unit of a path delay fault will now be described. An example of results of a fault simulation which is performed upon the CMOS integrated circuit under test shown in FIG. 14 is illustrated in FIG. 20. In FIG. 20, the first, the second, the third and the fourth column have the same meaning as in FIG. 15. The fifth column show a set of path delay faults (a fault list) which are detectable by the transient power supply current testing when each test pattern sequence is applied to the CMOS integrated circuit under test. When the integrated circuit under test has a path delay fault, an output transition time from the faulty path is retarded. Concomitantly, a change in the output transition time of every or any one of logic gates located on the faulty path causes the timing of a peak in the transient current of a next stage logic gate which receives the output from such logic gate at its input to be retarded, whereby the transient power supply current of the integrated circuit under test exhibits an abnormality. Accordingly, by applying a test pattern sequence to the integrated circuit under test and observing whether or not an abnormality occurs in the transient power supply current of the integrated circuit under test, it is possible to determine whether or not a path delay fault has occurred on any signal propagation path on which every logic gate on this path undergoes a switching operation (either rising or falling transition) in response to the input test pattern sequence.

By way of example, when the test pattern sequence T1 is applied to the CMOS integrated circuit under test as shown in FIG. 14, there occurs a transition signal F(1) at the output node $n_1$ of the logic gate $G_1$ disposed within the CMOS integrated circuit under test, as shown in FIG. 21a. Similarly, signals R(2), R(4) and R(5) occur at the outputs of the logic gates $G_2$, $G_4$ and the output buffer $G_6$, respectively. In this manner, because every logic gate located on a signal propagation path $\{x_1, n_1, n_2, n_4, z_1\}$ is subject to a switching operation, it follows that whenever there is a path delay fault on the signal propagation path $\{x_1, n_1, n_2, n_4, z_1\}$, an abnormality in the transient power supply current is observed during the transient power supply current testing which uses the test pattern sequence T1. In other words, the transient power supply current testing which uses the test pattern sequence T1 allows a path delay fault or faults on the signal propagation path $\{x_1, n_1, n_2, n_4, z_1\}$ to be detected. In this manner, a detected fault list which can be obtained with the test pattern sequence T1 can be determined by the described fault simulation to be as $\{\{x_1, n_1, n_2, n_4, z_1\}\}$.

In another example, when a test patterns sequence T2 is applied to the CMOS integrated circuit under test, a transition signal F(1) occurs at the output node $n_1$, of the logic gate $G_1$ within the CMOS integrated circuit under test, and similarly, signals R(2), F(4), R(4)–F(6), R(5)–F(7) occur at the outputs of the logic gates $G_2$, $G_3$, $G_4$ and the output buffer $G_6$, as shown in FIG. 21b. Since every logic gate located on signal propagation paths $\{x_1, n_1, n_2, n_4, z_1\}$ and $\{x_1, n_1, n_3, n_4, z_1\}$ is subject to a switching operation, if there is a path delay fault on either signal propagation path $\{x_1, n_1, n_2, n_4, z_1\}$ or $\{x_1, n_1, n_3, n_4, z_1\}$, an abnormality in the transient power supply current is observed during the transient power supply current testing which uses the test pattern sequence T2. If a path delay time on the signal propagation path $\{x_1, n_1, n_2, n_4, z_1\}$ increases, the rising transition R(5) at the output signal line $z_1$ will be retarded, causing a likelihood that a signal transition may not occur at $z_1$. This prevents the path delay time on the signal propagation path $\{x_1, n_1, n_2, n_4, z_1\}$ from being determined by the transient power supply current testing, resulting in a failure to detect a path delay fault on the signal propagation path $\{x_1, n_1, n_2, n_4, z_1\}$. Thus, a path delay fault or faults which can be detected by the transient power supply current testing which uses the test pattern sequence T2 are only those path delay faults which occur on the signal propagation path $\{x_1, n_1, n_3, n_4, z_1\}$. Consequently, a detected fault list which can be determined with the test pattern sequence T2 is determined from the described fault simulation to be $\{\{x_1, n_1, n_3, n_4, z_1\}\}$.

Generally, when there occur a plurality of transition signals on a signal line in response to a test pattern sequence, a path delay fault which is detectable by the transient power supply current testing is only a path delay fault on a signal transmission path which gives rise to a transition signal on the signal line, that is the same as a last transition signal on the signal line. For example, it may be assumed that transition signals R(a)–F(b)R(c)–F(d)–R(e) occur on a signal line in response to a test pattern sequence. Here it is assumed that transition times a, b, c, d and e are related such that a<b<c<d<e. In this instance, a signal transmission path which can be tested by the transient power supply current testing is limited to only a path which produce transition signals R(a), R(c) and R(e).

It will be understood from the foregoing that a fault list in unit of a path delay fault which are detectable with a test pattern sequence can be prepared. A signal transmission path having a path delay fault which is registered with a fault list is not limited to those paths which extend from an input terminal to an output terminal of a circuit under test, but may also include a signal transmission path such as $\{x_1, n_1\}$ or $\{x_1, n_1, m_3\}$ in the semiconductor integrated circuit shown in FIG. 14 which does not reach the output terminal.

In addition, the fault simulation method and the fault simulator according to the present invention is not limited to in its application to a CMOS integrated circuit, but is equally applicable to other types of semiconductor integrated circuits.

BRIEF DESCRIPTION OF THE DRAWINGS

FIG. 4a is a schematic illustration of a perfect open fault, FIG. 4b is an exemplary illustration of an input/output with respect to the location of a fault, FIG. 4c illustrates a model of a delay open fault, and FIG. 4d illustrates an example of input/output with respect to the fault location;

FIG. 10a is a circuit diagram indicating a model for a very small open fault which is present on an input signal line of a CMOS inverter, FIG. 10b graphically shows an exemplary output waveform when there is no fault, and FIG. 10c graphically shows an exemplary output waveform when there is a fault;

FIG. 11 graphically shows a change in the integral of the transient power supply current of CMOS integrated circuit plotted against the resistance of a very small open fault present on a path under test of CMOS integrated circuit;

FIG. 15 is a chart showing an example of results of the fault simulation performed upon the circuit shown in FIG. 14 when considering gate delay faults;

FIG. 18 is a chart showing an example of results of the fault simulation according to the present invention which is applied to open faults;

FIG. 20 is a chart showing an example of results of the fault simulation according to the present invention when path delay faults are considered;

DESCRIPTION OF EMBODIMENTS

Several embodiments of the present invention will now be described.

Figure 22:
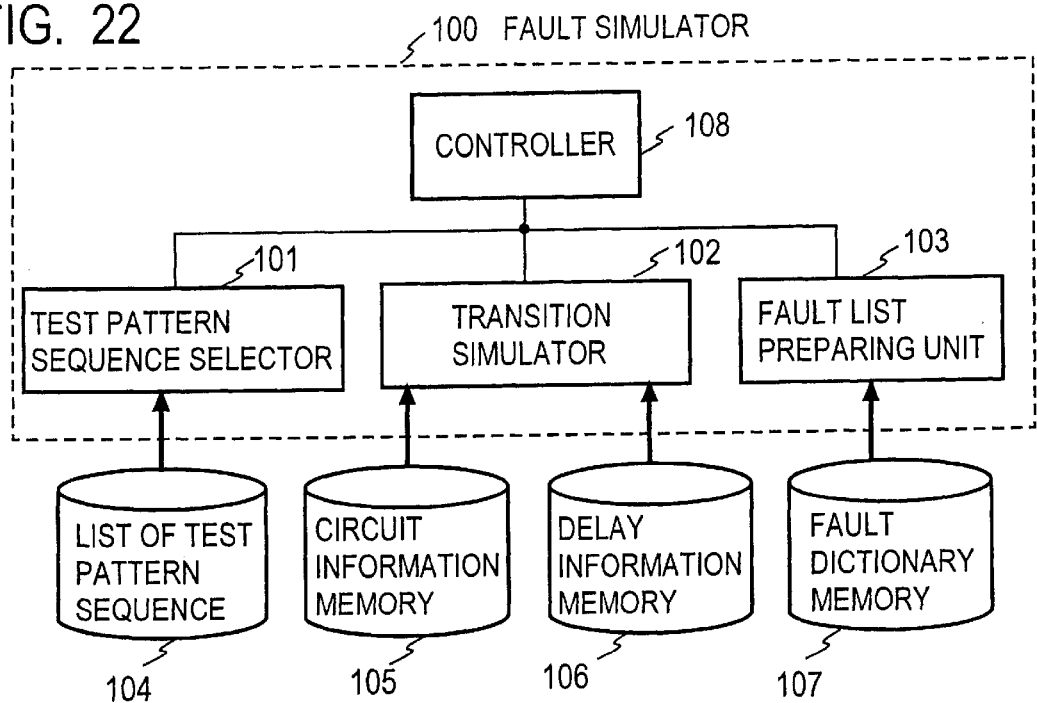
FIG. 22 is an illustration of the functional arrangement of the fault simulator according to the present invention.

FIG. 22 shows an exemplary functional arrangement of a fault simulator according to an embodiment of the present invention. The simulator 100 comprises a test pattern sequence selector 101 which selects a test pattern sequence, formed by two or more test patterns and which is used in preparing a fault list, from a list of test pattern sequence 104; a transition simulator 102 which performs a simulation of transitions occurring in an integral circuit under test when the selected test pattern sequence from the selector 101 is input thereto to calculate a train of transition signal values on signal lines within the circuit, while discriminating between a rising transition and a falling transition, on the basis of circuit information of the integrated circuit under test which is available from a circuit information memory 105 and delay information of individual logic gates therein which is available from a delay information memory 106; a fault list preparing unit 103 which utilizes the train of transition signal values on various signal lines which are calculated by the transition simulator 102 to prepare a fault list which are detectable by the transient power supply current testing which uses the test pattern sequence for storage in a fault dictionary memory 107; and a controller 108 which operates the selector 101, the simulator 102 and the unit 103. Specifically, for a semiconductor integrated circuit under test having three input terminals, the test pattern sequence list 104 and the test pattern sequence selector 101 may comprise tree pseudo-random pattern sequence generators to provide random pattern sequence having mutually different initial values, but are synchronized with a common clock For each clock, each individual output from the three pseudo-random pattern sequence generators may be derived as a test pattern. Alternatively, a 3-bit counter may be operated with a clock, and a count represented by the three bits may be derived as test patterns. In addition, this may be implemented by a software. As a further alterative, required test patterns may be stored in a memory, and may be sequentially taken out. At any rate, the pseudo-random pattern sequence generator may have a number of shift stages or a sufficient number of test pattern sequence may be stored in the memory so that test patterns are available for providing sufficient data to enable a delay fault of any logic gate with a distinction between a rising and a falling transition, an open fault on any signal line and a delay fault on any path to be detected as a detectable fault. The test pattern sequence selector 101 is provided for supplying such a test pattern sequence to the transition simulator 102, the requirement upon the selector 101 being that it is capable of deriving a test pattern sequence from the test pattern sequence list 104 or generating it otherwise to feed the transition simulator 102.

When the transition simulator 102 is implemented in a software, the software sequentially performs calculations for each logic gate in the semiconductor integrated circuit under test using the circuit information from the memory 105 and the delay information from the memory 106 when each of the test pattern is applied to the semiconductor integrated circuit under test, thus determining transitions between logic values based on the results of these calculations, including a rising transition R, a falling transition F, no transition L or H together with a delay time from the application of the test pattern and storing these results for each signal line on which the transition signal value appears. This is repeated for each test pattern, thus easily obtaining a train of transition signal values occurring on various signal lines. A general purpose event driven logic simulator, such as VHDL System Simulator (VSS) from Synopsis, may be used for the transition simulator 102. Means 103 for preparing a fault list will be described later.

Figure 23:
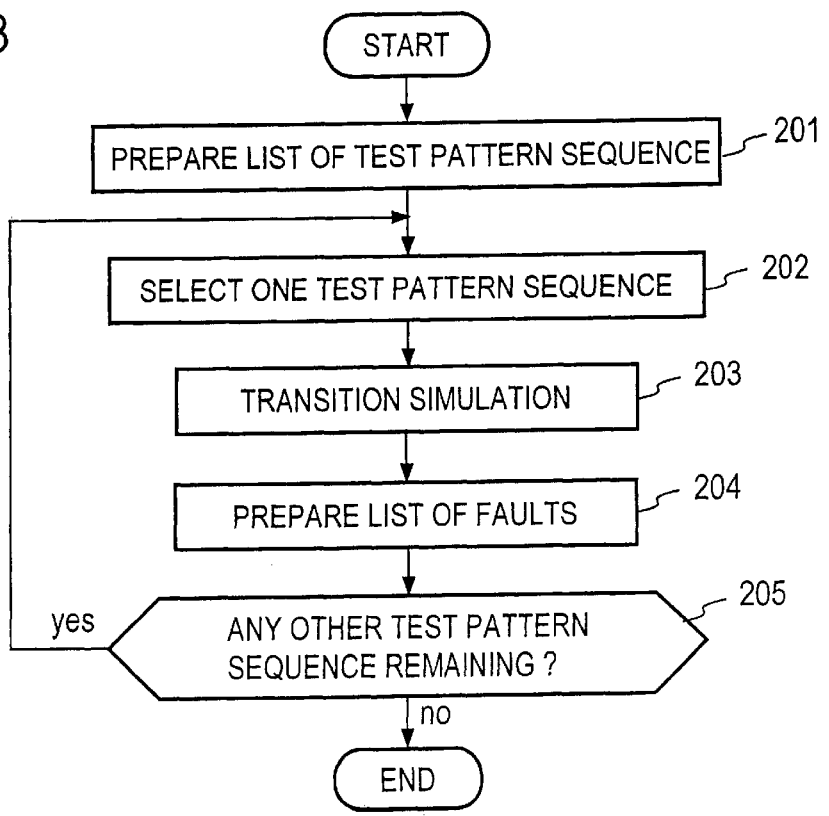
FIG. 23 is a flow chart according to an embodiment of the fault simulation method according to the present invention.

The operation of performing a fault simulation of the semiconductor integrated circuit using the fault simulator 100 according to the present invention will now be described. FIG. 23 shows an exemplary processing procedure for the fault simulation method of the present invention. Initially, at step 201, the fault simulator 100 prepares a list of test pattern sequence which are required for performing a fault simulation. Any test pattern is registered with the list. As mentioned previously, the list may not necessarily be prepared beforehand, but an arrangement may be made so that required test pattern sequence can be obtained from random pattern generators, for example.

At step 202, the test pattern sequence selector 101 selects one of the test pattern sequence from the test pattern sequence list, for which it is desired to prepare a fault list Accordingly, one test pattern sequence is selected arbitrarily from the test pattern sequence list which is previously provided, or one test pattern sequence is obtained from the test pattern sequence generators. At step 203, the transition simulator 102 performs a transition simulation assuming that the test pattern sequence selected at step 102 has been input to the integrated circuit under test, using the circuit information of the semiconductor integrated circuit under test and delay information of logic gates, thus calculating a train of transition signal values which occur on various signal lines within the circuit. At step 204, the fault list preparing unit 103 prepares a fault list which are detectable with the selected test pattern sequence on the basis of the train of transition signal values occurring on signal lines within the circuit which are obtained at step 203.

Finally, at step 205, the controller 108 confirms to see whether or not there remains any test pattern sequence in the test pattern sequence list which has not yet been processed and also confirms whether or not there has been a sufficient number of test pattern sequence to enable the required detection of faults during a phase of deriving the test pattern sequence from the test pattern sequence list. If it is found that there is a test pattern sequence which is not yet processed or which has not been generated, the steps 202, 203, 204, and 205 are repeated. On the other hand, if there is no test pattern sequence which has not been processed or if a sufficient number of test pattern sequence have been generated, the operation is completed. The controller 108 exercises a control for sequentially operating the various units to perform the described steps in sequence. At step 204 where the fault list is prepared, the fault list may be prepared in unit of a gate delay fault, in unit of an open fault or in unit of a path delay fault. It is to be noted that the function of the fault simulator 100 can be served by using a computer which executes a program. Thus, the controller 108 may comprise CPU or a processor which executes a program stored in a memory, thus implementing the operation of the test pattern sequence selector 101, the transition simulator 102 and the fault list preparing unit 103 through the execution of the program. The operation of each of such units may be implemented by executing a subroutine, which may be partly assisted by a hardware.

Figure 24:
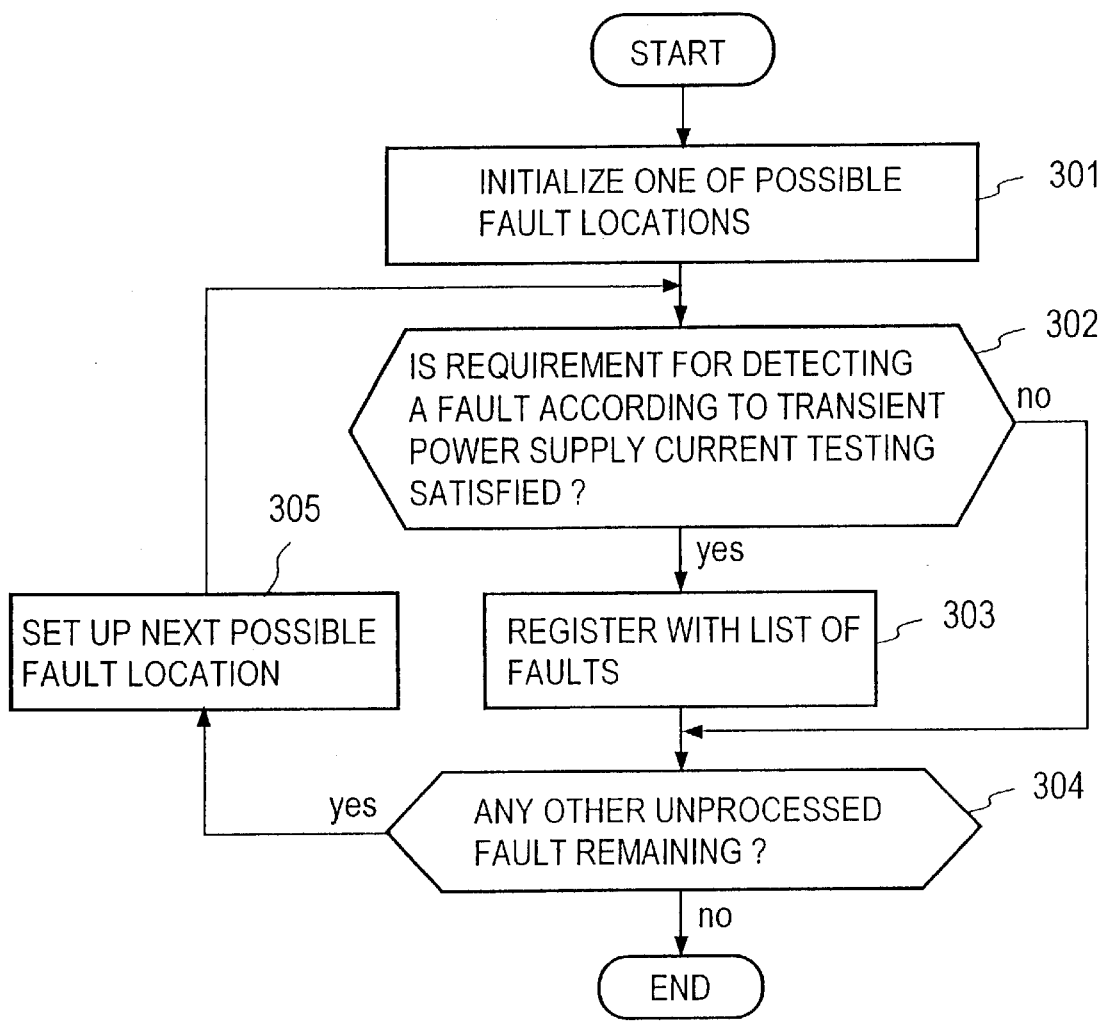
FIG. 24 is a flow chart of a specific procedure of the fault list preparing step shown in FIG. 23.

FIG. 24 shows an exemplary processing procedure for preparing the fault list which takes place at step 204 in FIG. 23. Initially, at sep 301, one of possible faults in the semiconductor integrated circuit under test is selected for purpose of initialization. At next step 302, a confirmation is made to see whether or not the train of transition signal values which are calculated by the transition simulator 402 satisfy the requirement for detecting the fault according to the transient power supply current testing in the event a fault has occurred at the location which is set up as mentioned above. If the train of Position signal values satisfy the requirement for detecting the fault according to the transient power supply current testing, the selected location is registered with a fault list at step 303. However if it is found at step 302 that the train of transition signal values do not satisfy the requirement for detecting the fault according to the transient power supply current testing, the operation proceeds to step 304 where a confirmation is made to see whether or not there remains any other unprocessed location which is likely to cause a fault, and if there is an unprocessed location having a likelihood of fault, a next location which is likely to cause a fault is set up at step 305 before returning to step 302. In this manner, steps 302, 303, 304 and 305 are repeated until every location within the semiconductor integrated circuit under test which is likely to cause a fault is processed, and when there remains no unprocessed location, the operation is completed.

Figure 25:
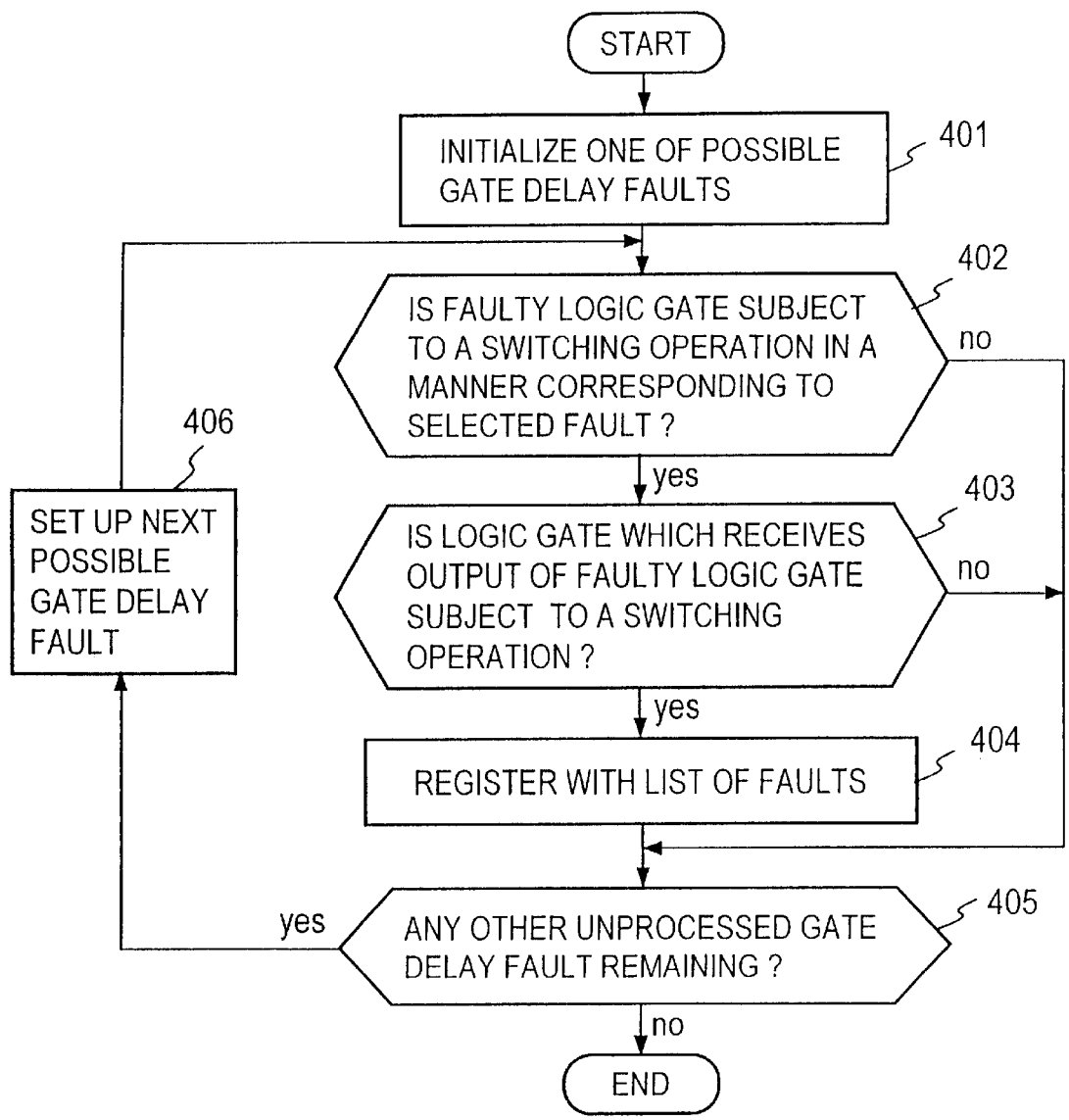
FIG. 25 is a flow chart showing an exemplary procedure when the fault list preparing step shown in FIG. 23 is applied for preparing a fault list in unit of a gate delay fault.

FIG. 25 shows an exemplary processing procedure for the preparation of the fault list which takes place at step 204 in FIG. 23 in case the fault list is prepared in unit of a gate delay fault. Initially, at step 401, one of gate delay faults (logic gate) which are likely to occur in a semiconductor integrated circuit under test is selected with a distinction of the direction in which the transition occurs for purpose of initialization. At step 402, a confirmation is made to see whether or not a logic gate having the gate delay fault (or a faulty logic gate) is subject to a switching operation in a proper manner including the direction of transition so as to conform to the gate delay fault which is set up by the initialization, on the basis of results of the transition simulation which is calculated by the transition simulator 102. If the faulty logic gate is properly subject to a switching operation, the operation proceeds to step 403, but if the faulty logic gate is not properly subject to a switching operation, the operation transfers to step 405.

Figure 1A:
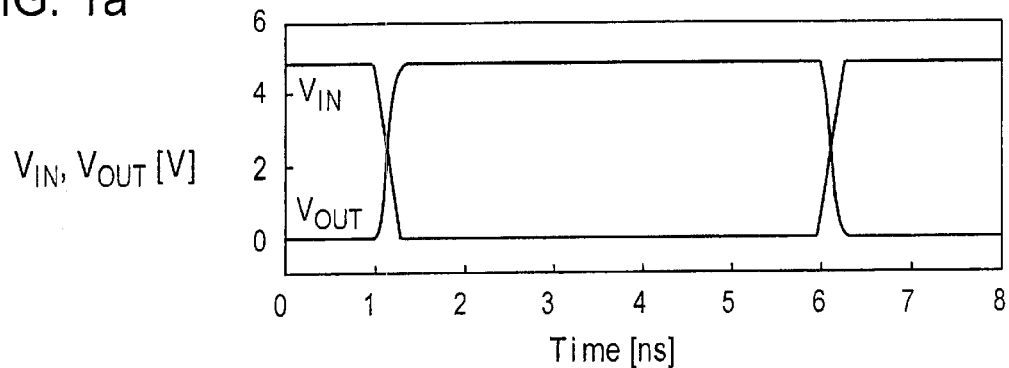
FIG. 1a is a plot indicating an input voltage $V_{IN}$ and an output voltage $V_{OUT}$ in a typical CMOS inverter against time, FIG. 1b graphically shows an example of the transient response of power supply current $I_{DD}$.
Figure 1B:
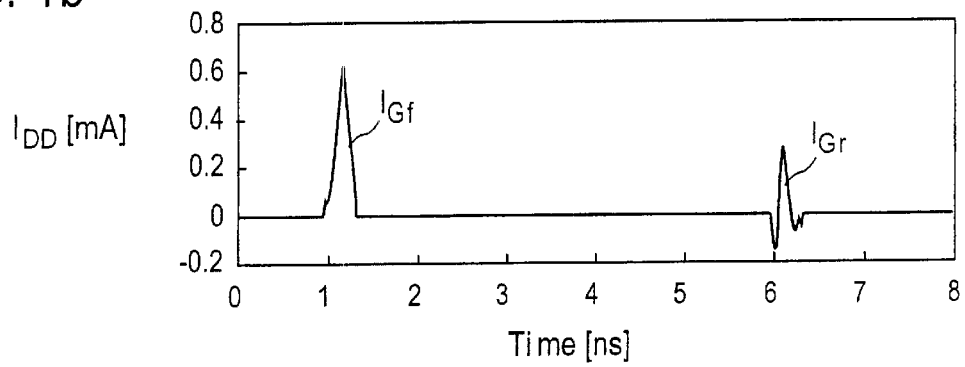
FIG. 1c shows the CMOS inverter circuit and also showing a plot of the power supply current which flows upon the rising transition of the output and FIG. 1d shows the CMOS inverter circuit together with a plot of the power supply current which flows upon the falling transition of the output.
Figure 1C:
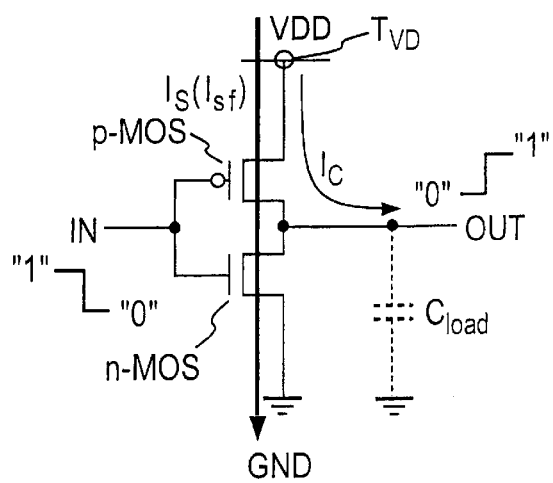
Figure 1D:
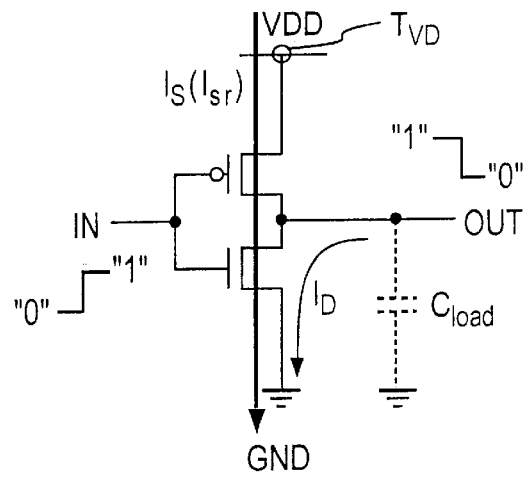
Figure 2A:
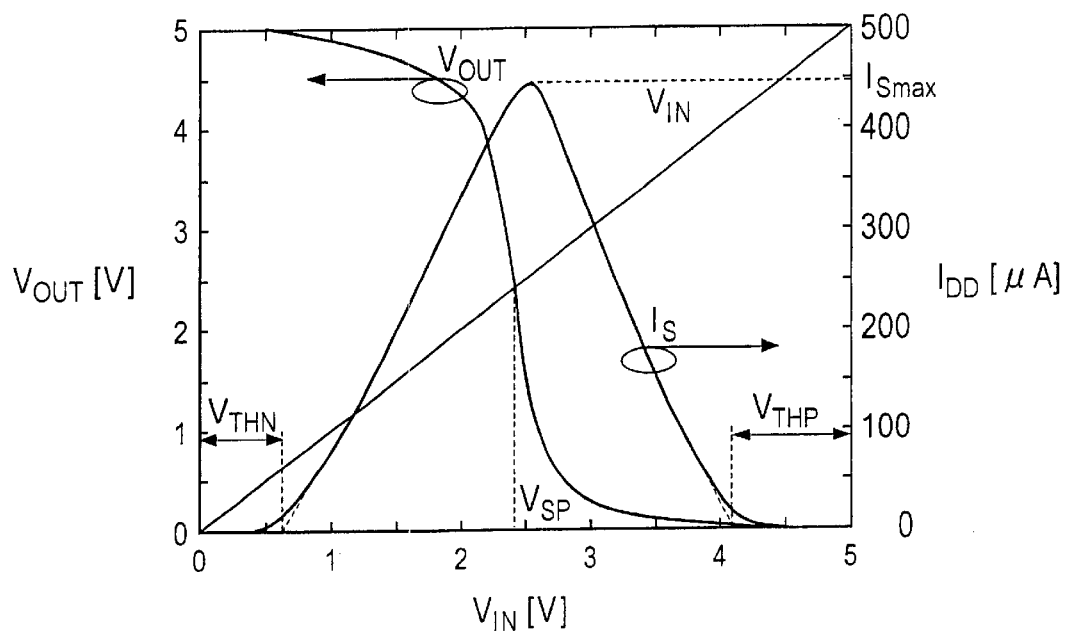
FIGS. 2a and 2b graphically show a typical example of the transient response of CMOS logic gate, FIG. 2a showing an input voltage $V_{IN}$, an output voltage $V_{OUT}$ and the transfer characteristic of the supply current $I_S$, FIG. 2b illustrating an approximated waveform of the transient current.
Figure 2B:
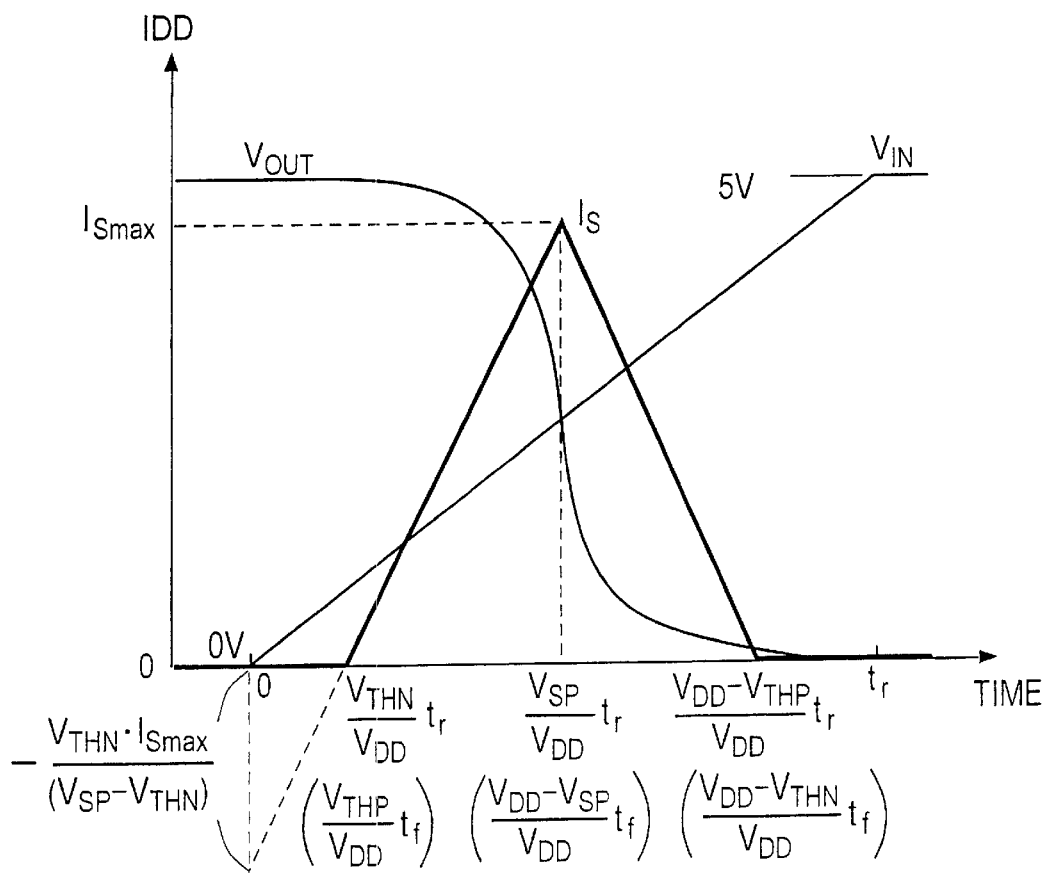
Figure 3A:
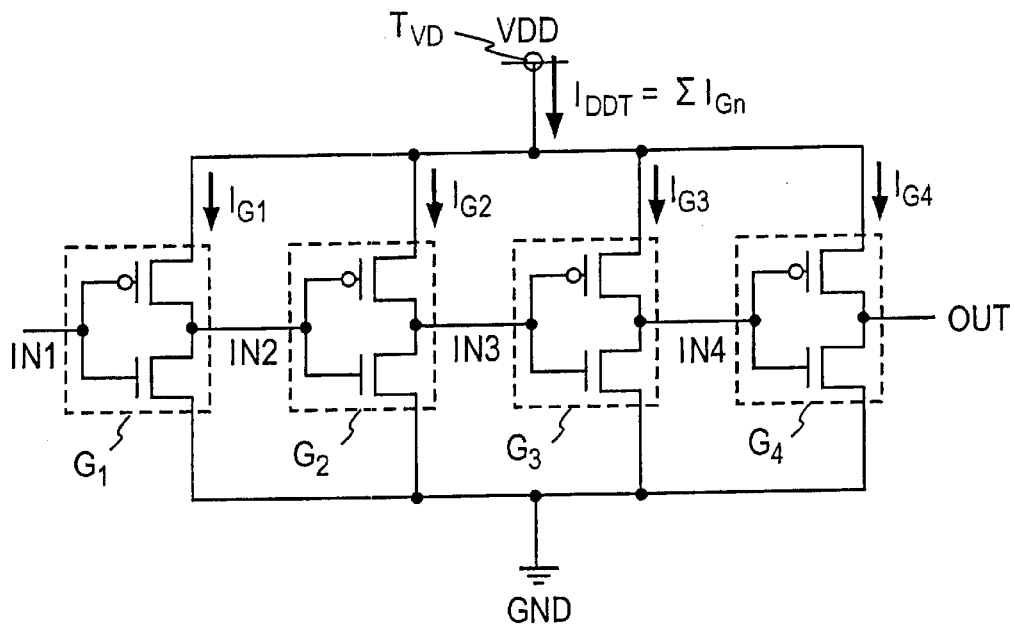
FIG. 3a is a circuit diagram of an exemplary CMOS integrated circuit.
Figure 3B:
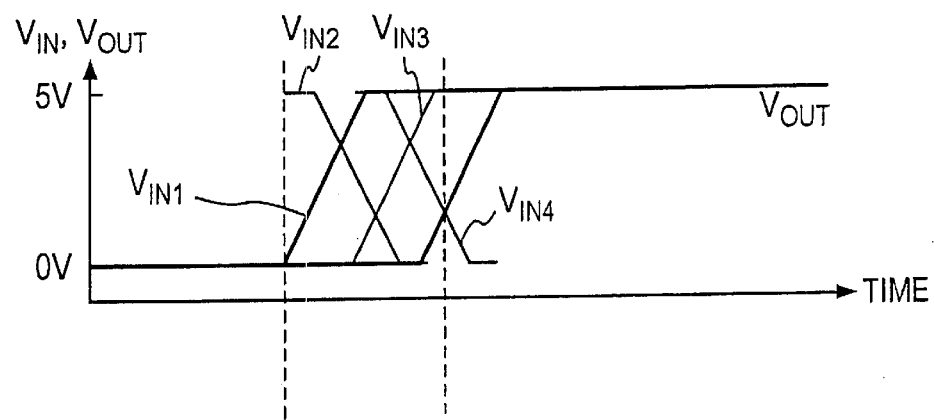
FIG. 3b is a plot graphically illustrating an input voltage and an output voltage of the integrated circuit against time.
Figure 3C:
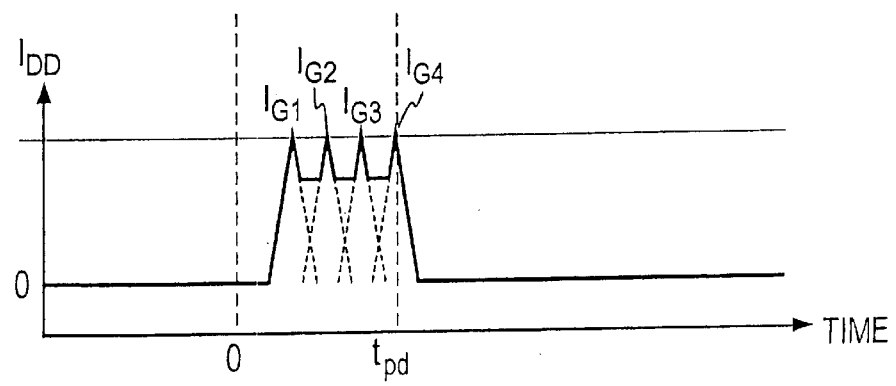
FIG. 3c is a plot of the transient power supply current response $I_{DDT}$ against time.
Figure 5A:
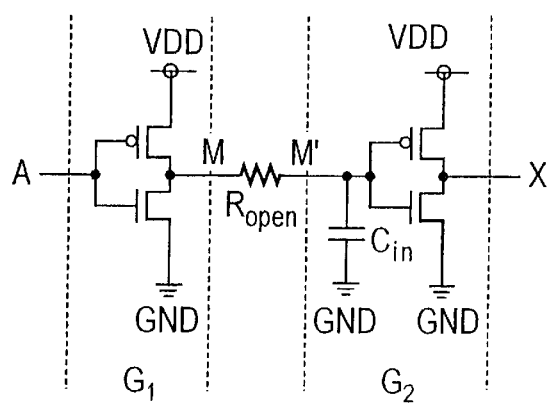
FIG. 5a is a circuit diagram of an exemplary MOS integrated circuit having an open fault, and FIGS. 5b and 5c graphically show examples of output waveforms when there is no open fault and when there is an open fault.
Figure 5B:
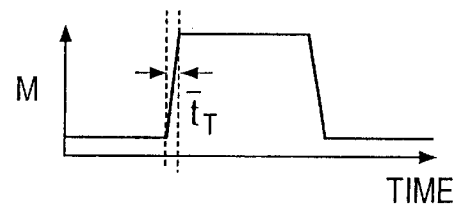
Figure 5C:
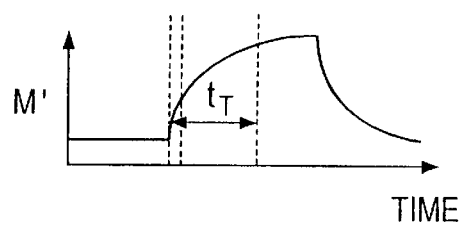
Figure 6:
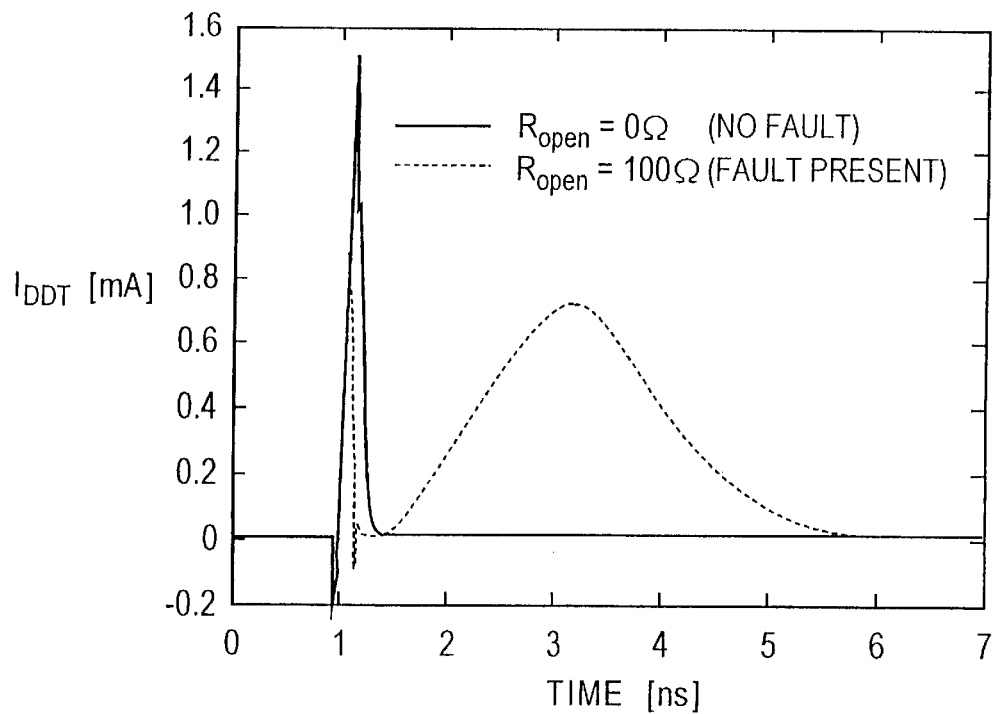
FIG. 6 graphically shows an exemplary transient power supply current response of CMOS integrated circuit having an open fault.
Figure 7A:
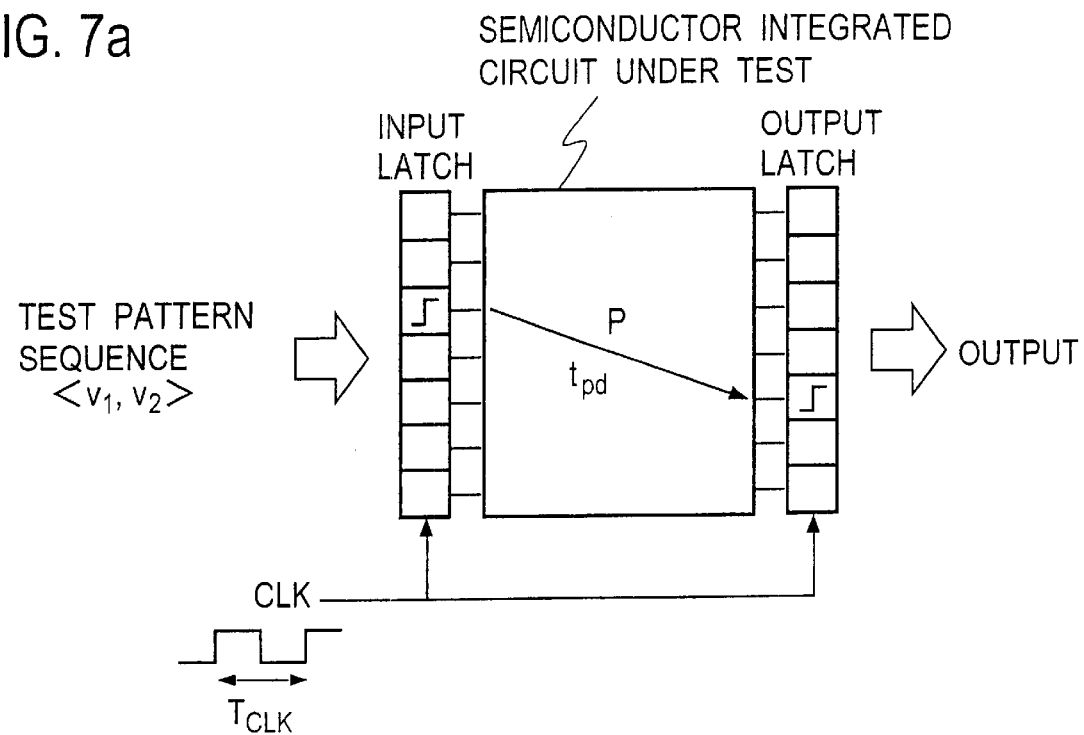
FIG. 7a is a schematic illustration of the fundamental principle of the path delay fault testing method, FIG. 7b graphically shows input/output voltage, and FIG. 7c graphically shows a corresponding system clock.
Figure 7B:
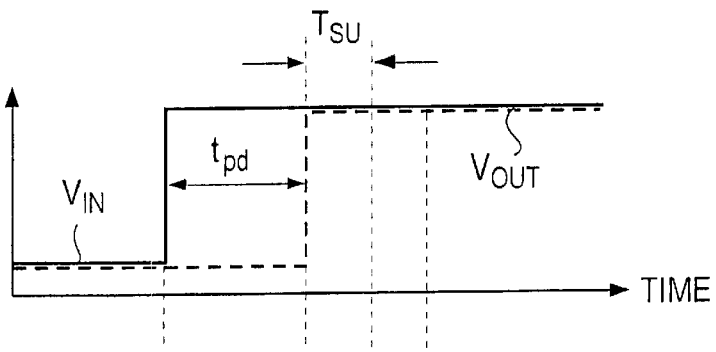
Figure 7C:
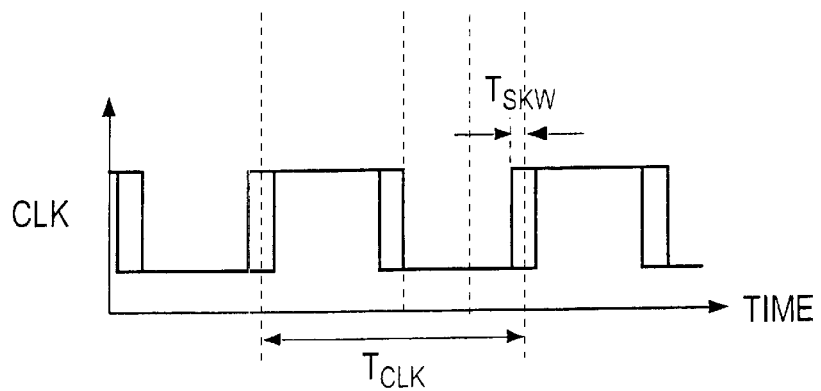
Figure 8:
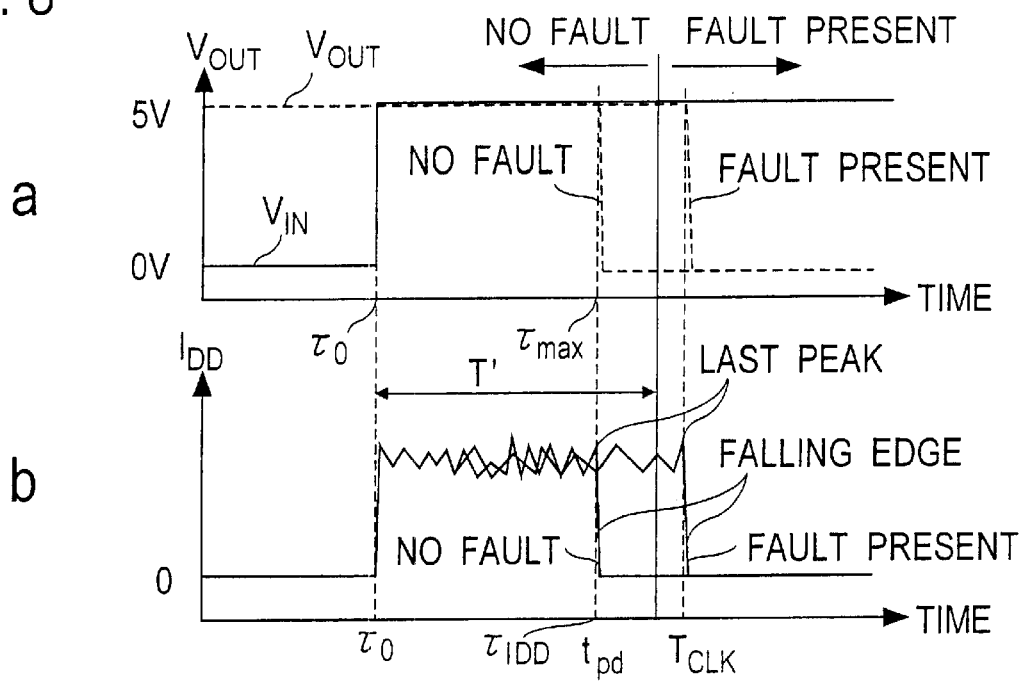
FIG. 8 illustrates the principle of the transient power supply current testing technique which utilizes the pulse width of the transient power supply current, FIG. 8a indicating an input/output voltage plotted against time and FIG. 8b indicating a transient power supply current plotted against time.
Figure 9:
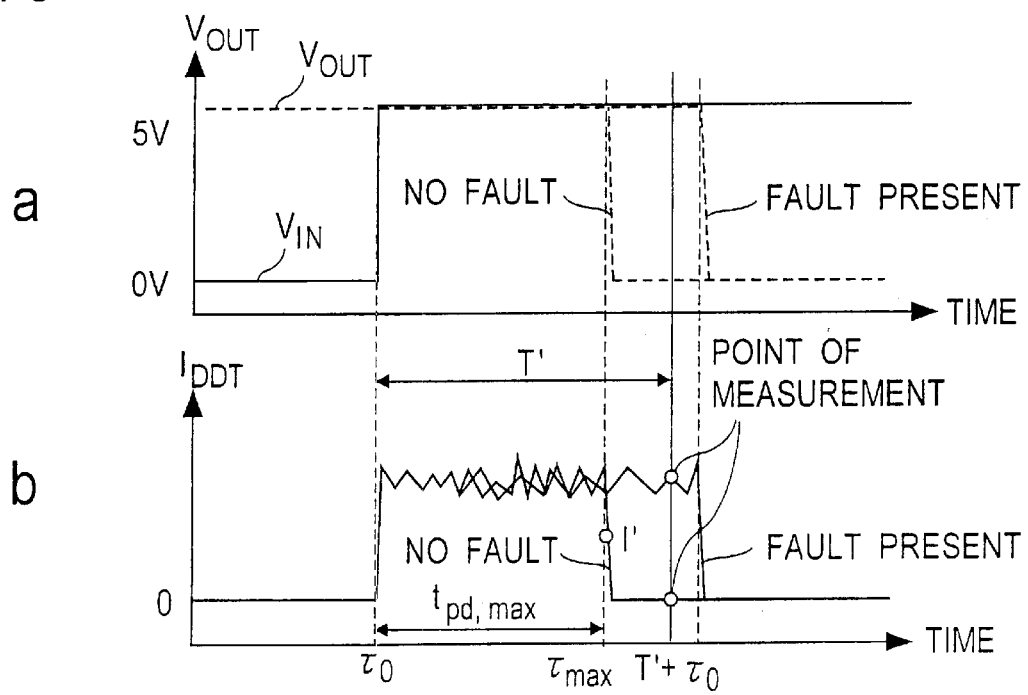
FIG. 9 illustrates the principle of the transient power supply current testing technique which utilizes the instantaneous value of the transient power supply current, FIG. 9a indicating an input/output voltage plotted against time and FIG. 9b indicating a transient power supply current plotted against time.
Figure 12:
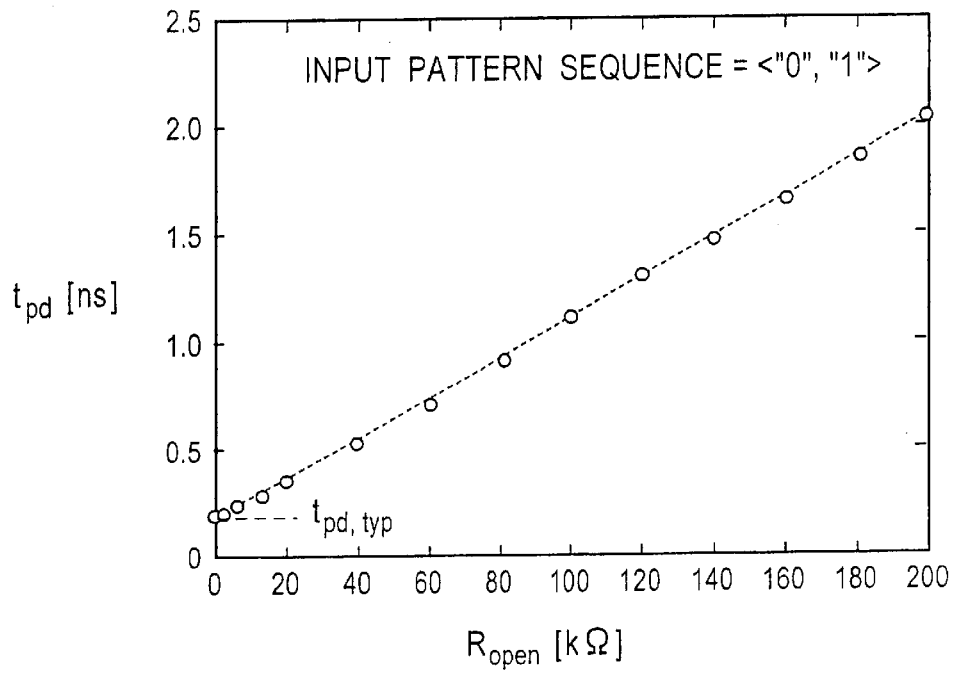
FIG. 12 graphically shows a change in the path delay time of a path under test plotted against the resistance of a very small open fault present on a path under test of CMOS integrated circuit.
Figure 13:
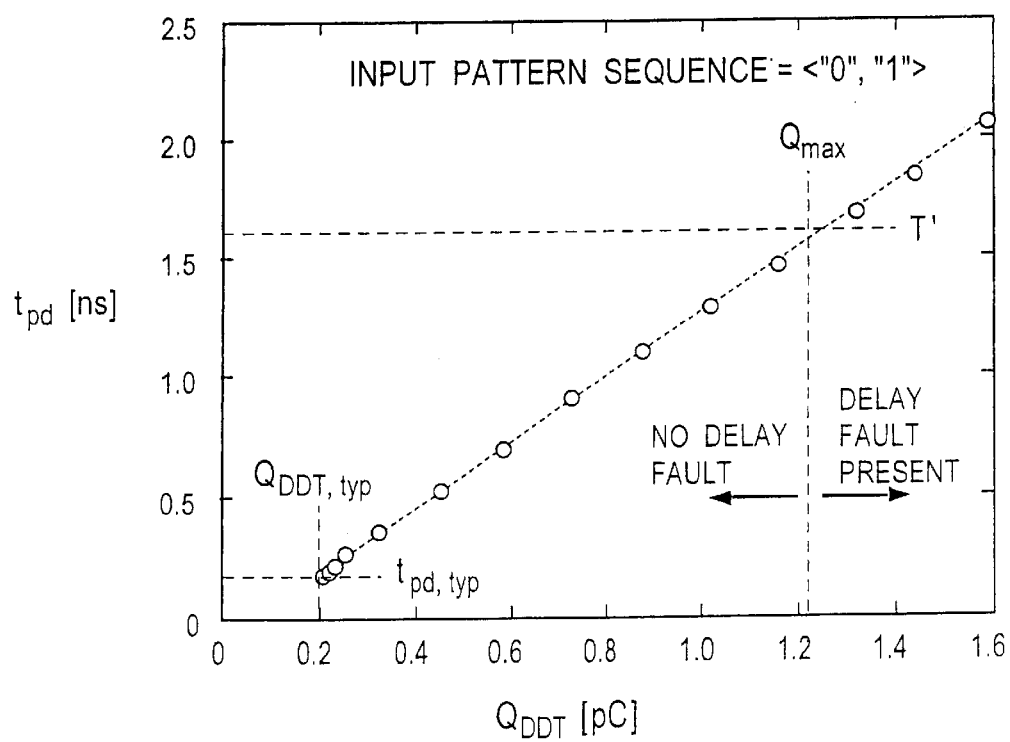
FIG. 13 graphically shows the linearity of the relationship between the path delay time of the path under test and the integral of the transient power supply current of CMOS integrated circuit when the presence of a very small open fault is assumed on the path under test of CMOS integrated circuit.
Figure 14:
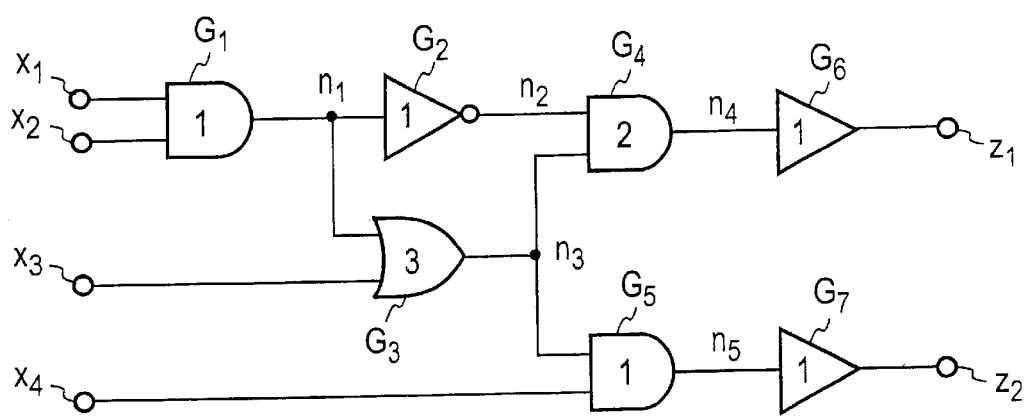
FIG. 14 is a circuit diagram of an exemplary CMOS integrated circuit under test which is used to illustrate the fault simulation method according to the present invention.
Figure 16:
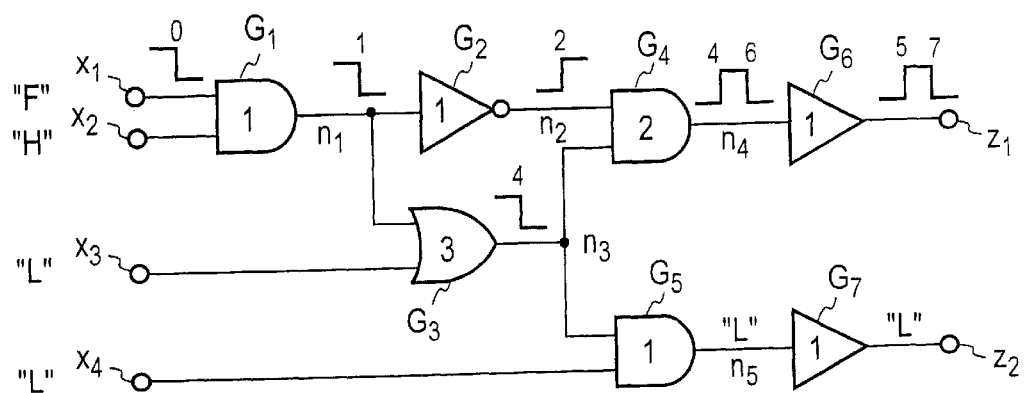
FIG. 16 is a circuit diagram, illustrating results of the fault simulation which is performed upon the circuit shown in FIG. 14 when a test pattern sequence is applied thereto.
Figure 17:
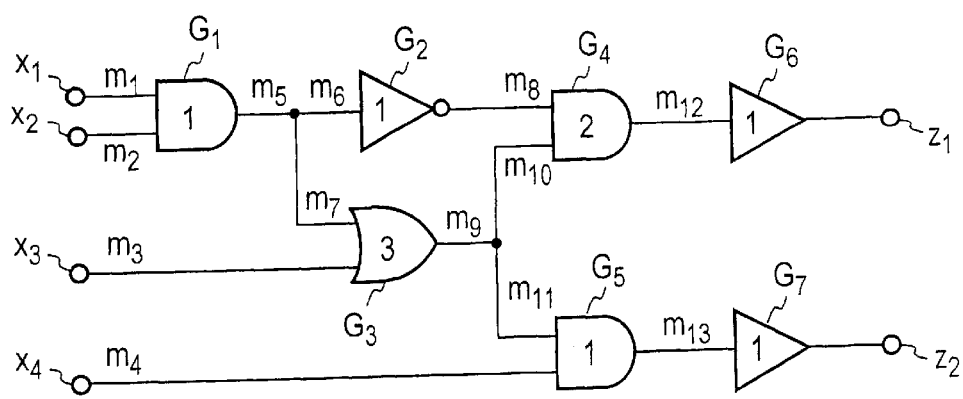
FIG. 17 is a circuit diagram of an exemplary CMOS integrated circuit under test when open faults are considered.
Figure 19:
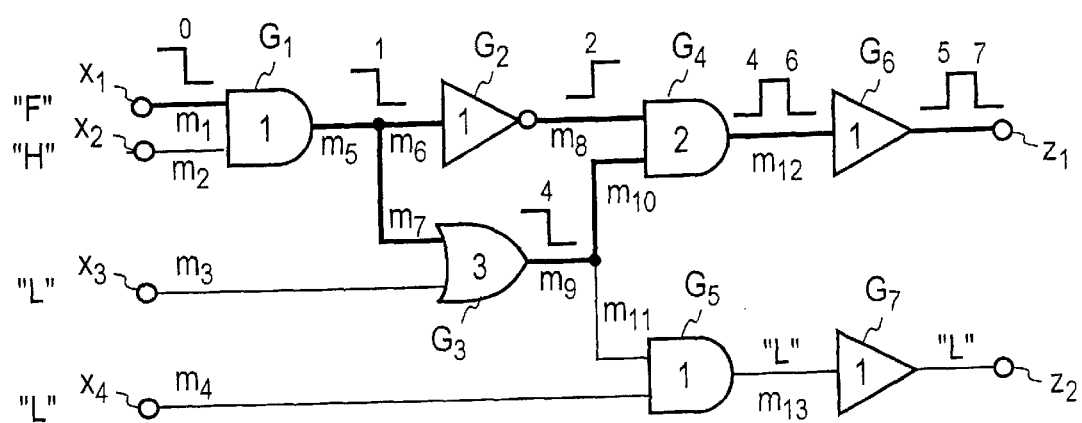
FIG. 19 is a circuit diagram illustrating results of transition simulation applied to the circuit shown in FIG. 17 when the test pattern sequence T2 is applied thereto.

At step 402, if the gate delay fault which is set up is a slow-to-rise fault, a confirmation is made to see whether or not the output from the faulty logic gate has a rising transition. Conversely, if the gate delay fault which is set up is a slow-to-fall fault, a confirmation is made to see whether or not the output from the faulty logic gate has a falling transition. At next step 403, a confirmation is made to see whether or not the output signal line of a logic gate (load logic gate) which input is connected to the output of the logic gate having the gate delay fault is subject to a switching operation, on the basis of results of the fault simulation which is calculated by the transition simulator 102. If the output signal line of the load logic gate is subject to a switching operation, the gate delay fault is registered with the fault list at step 404. On the other hand, if the output signal line of the load logic gate is not subject to a switching operation, the operation transfers to step 405. By way of example, if a gate delay fault $G_1F$ is set up in the semiconductor integrated circuit under test shown in FIG. 14, a proper falling transition of the faulty logic gate $G_1$ is confirmed by the test pattern sequence T1, T2 and T3 at step 402, and the fact that the output line of the load logic gate $G_2$ is subject to a switching operation in response to the test pattern sequence T1, T2 and T3 is confirmed at step 403. Accordingly, $G_1F$ is registered for each of the test pattern sequence T1, T2 and T3 or the test pattern sequence T1, T2 and T3 are registered with $G_1F$ at step 404. Similarly, when $G_1R$ is set up, a proper rising transition of the faulty logic gate $G_1$ is confined by the test pattern sequence T4 and T5 and a switching operation of the output line of the load logic gate $G_2$ is confirmed by the test pattern sequence T4 and T5. Accordingly, $G_1R$ is registered with each of T4 and T5 or T4 and T5 are registered with $G_1R$ At step 405, a confirmation is made to see whether there remains any other unprocessed gate delay fault If there remains an unprocessed gate delay fault, next possible gate delay fault is set up at step 406, and the steps 402, 403, 404 and 405 are repeated. However, if there remains no unprocessed gate delay fault, the operation is completed.

Figure 26:
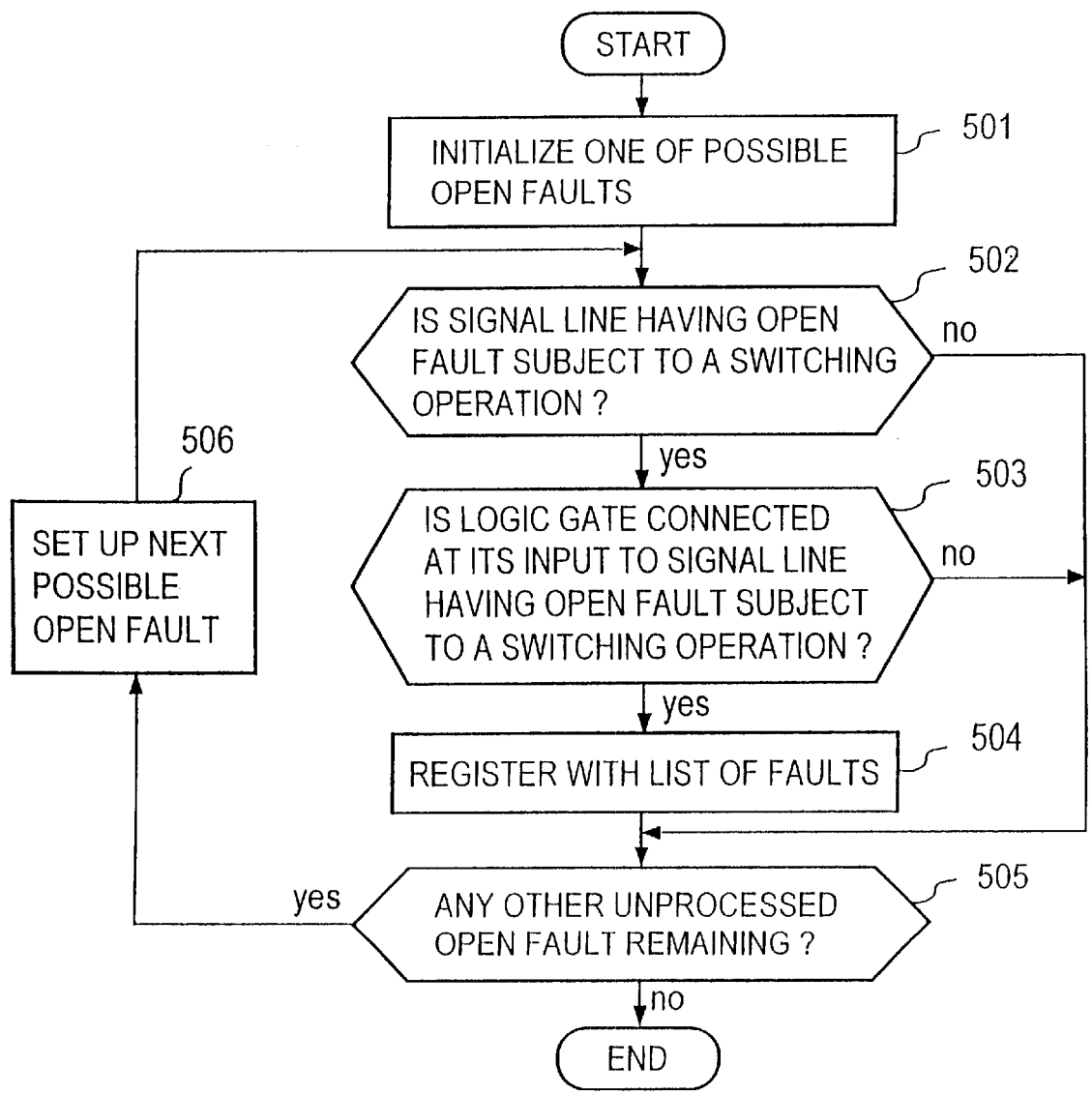
FIG. 26 is a flow chart of an exemplary procedure when the fault list preparing step shown in FIG. 23 is applied for preparing a fault list in unit of an open fault.

FIG. 26 shows an exemplary processing procedure for preparing a fault list which takes place at step 204 in FIG. 23 when preparing a fault list in unit of an open fault Initially, at step 501, one of open faults which are likely to occur in a semiconductor integrated circuit under test is selected for purpose of initialization. At next step 502, a confirmation is made to see whether or not a signal line having the open fault which is set up (or a faulty signal line) is subject to a switching operation, on the basis of the results of the transition simulation which is calculated by the transition simulator 102. If the faulty signal line is subject to a switching operation, the operation proceeds to step 503, but if the faulty signal line is not subject to a switching operation, the operation transfers to step 505.

At step 503, a confirmation is made to see whether or not the output signal line of a logic gate which input is connected to the faulty signal line (or a load logic gate) is subject to a switching operation, on the basis of results of the transition simulation calculated by the transition simulator 102. If the output signal line of the load logic gate is subject to a switching operation, the open fault is registered with a fault list at step 504. However, if the output signal line of the load logic gate is not subject to a switching operation, the operation transfers to step 505. At step 505, a confirmation is made to see whether or not there remains any other unprocessed open fault If there remains an unprocessed open fault, a next possible open fault is set up at step 506, and then the steps 502, 503, 504 and 505 are repeated. If there remains no other unprocessed open fault, the operation is completed.

Figure 27:
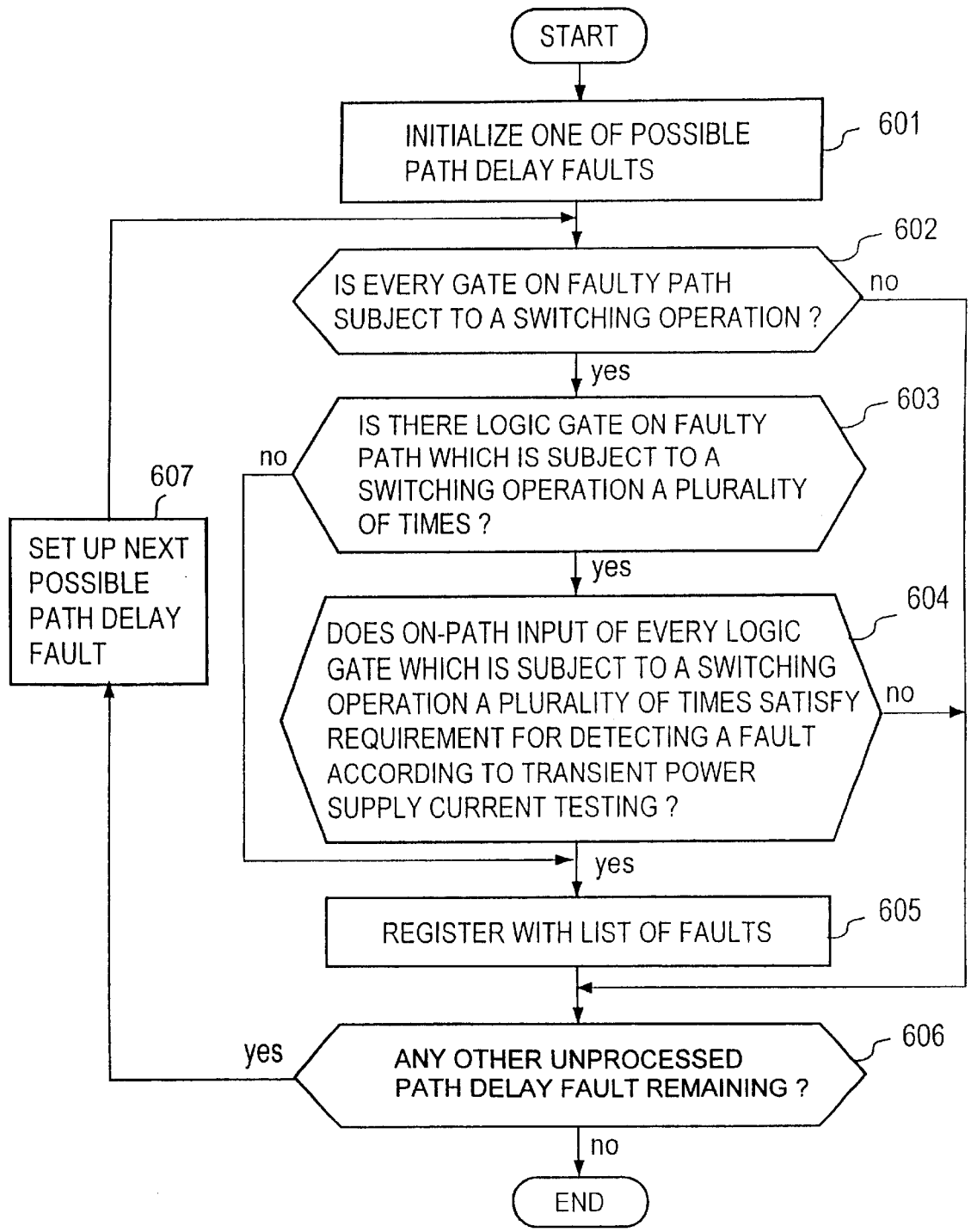
FIG. 27 is a flow chart of an exemplary procedure when the fault list preparing step shown in FIG. 23 is applied for preparing a fault list in unit of a path delay fault.

FIG. 27 shows an exemplary processing procedure for preparing a fault list which takes place at step 204 in FIG. 23 when preparing a fault list in unit of a path delay fault. Initially, at step 601, one of path delay faults which are likely to occur in a semiconductor integrated circuit under test is selected for purpose of initialization. At step 602, a confirmation is made to see whether or not every logic gate on a path having the selected path delay fault (or a faulty path) is subject to a switching operation, on the basis of the results of the transition simulation which is calculated by the transition simulator 102. If the every logic gate on the faulty path is subject to a switching operation, the operation proceeds to step 603, but if any one of the logic gates on the faulty path is not subject to a switching operation, the operation transfers to step 606.

At step 603, a confirmation is made to see whether or not there is a logic gate on the faulty path which is subject to a switching operation a plurality of times in response to a test pattern sequence which is selected at step 202 in FIG. 23, on the basis of results of the transition simulation which is calculated by the transition simulator 102. If there is a logic gate which is subject to a switching operation a plurality of times, the operation proceeds to step 604, but if there is no logic gate which is subject to a switching operation a plurality of times, the path delay fault is registered with a fault list at step 605.

Figure 21A:
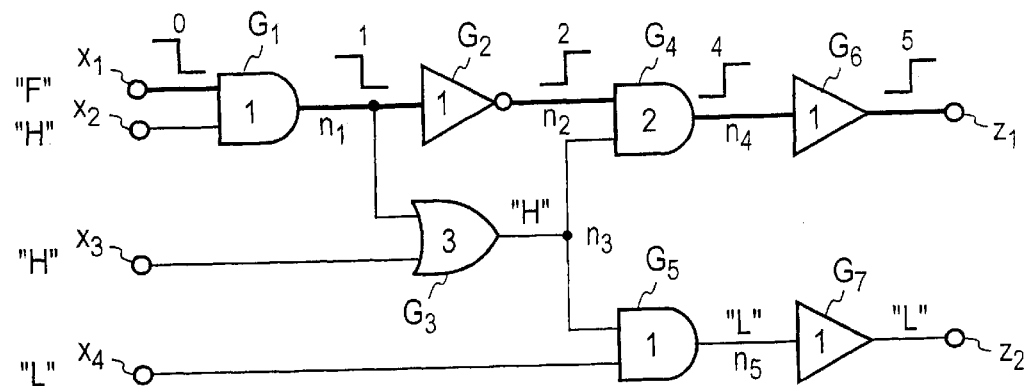
FIGS. 21a and 21b are circuit diagrams illustrating results of the transition simulation applied to the circuit shown in FIG. 14, showing signals appearing at various paths when a test pattern sequence T1 and T2 are applied thereto.
Figure 21B:
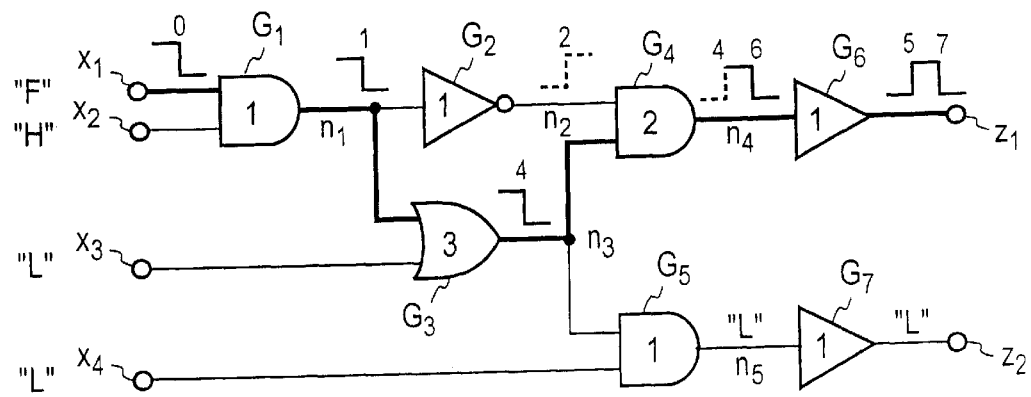

At step 604, a confirmation is made to see whether or not an on-path input of every logic gate which is subject to a switching operation a plurality of times (or an input signal line of a logic gate on the faulty path) satisfies the requirement for detecting the fault according to the transient power supply current testing. If the on-path input satisfies the requirement for detecting the fault according to the transient power supply current testing, the path delay fault is registered with the fault list at step 605. However, if the on-path input does not satisfy the requirement for detecting the fault according to the transient power supply current testing, the operation transfers to step 606. Thus, what occurs at step 604 is to confirm whether or not the output transition signal corresponding to the on-path input to the logic gate is the same kind of transition signal as the last transition signal on the output signal line of the logic gate, the confirmation taking place for every logic gate which is subject to a switching operation a plurality of times. For example, the logic gate $G_4$ shown in FIG. 21(*b*) is subject to a switching operation a plurality of times, and the output transition signal "F(6)" of the logic gate $G_4$ which corresponds to the input transition signal "F(4)" of the on-path input $n_3$ of the logic gate $G_4$ coincides with the last transition signal "F(6)" of the logic gate $G_4$. Accordingly, the on-path input $n_3$ satisfies the requirement for detecting a fault according to the transient power supply current testing. However, the last transition signal of the logic gate $G_4$ which corresponds to the input transition signal "R(2)" on the on-path input $n_2$ of the logic gate $G_4$ is equal to "F(6)", which is not of the same kind as "R(2)".

Thus, the on-path input $n_2$ does not satisfy the requirement for detecting a fault according to the transient power supply current testing.

At step 606, a confirmation is made to see whether or not there remains any other unprocessed path delay fault If there remains an unprocessed path delay fault, a next possible path delay fault is set up at step 607, and the steps 602, 603, 604, 605 and 606 are repeated. However, if there remains no other unprocessed path delay fault, the operation is completed.

The fault simulation method and the fault simulator according to the present invention are not limited in its application to a delay fault and an open fault, but may also be used for detecting other faults including a logic fault (stuck-at fault), a short-circuit fault and wrong parameters of MOS transistor, by suitably modifying the requirement for detecting the fault according to the transient power supply current testing and a fault model.

As discussed above, the fault simulation method and the fault simulator according to the present invention each allow a fault list to be prepared which can be detected by the transient power supply current testing with a given test pattern, even for a delay fault or an open fault which gives rise to a delay fault, either of which has been difficult in the prior art to detect, by using the transient power supply current testing technique which affords a high level of observability and which provide logic gate switching information. Accordingly, the efficiency of testing a delay fault or an open fault can be significantly improved.

What is claimed is:

1. A fault simulation method to prepare a list of detectable faults in a semiconductor integrated circuit, comprising a step of deriving a test pattern sequence formed by two or more test patterns;

a step of performing a transition simulation to determine a train of transition signal values occurring on various signal lines within the circuit when the derived test pattern sequence is applied to the semiconductor integrated circuit;

and a step of preparing a fault list which are detectable by the transient power supply current testing when the test pattern sequence is applied to the semiconductor integrated circuit, by using the train of transition signal values on signal lines.

2. A fault simulation method according to claim 1 in which the step of preparing a fault list takes place in unit of a delay fault of a logic gate, and comprises

- a step of setting up a gate delay fault which is likely to occur in the semiconductor integrated circuit with a distinction of the direction in which the transition occurs;
- a first confirmation step for the confirming whether or not the faulty logic gate which has the gate delay fault is properly subject to a switching operation including the direction of transition in a manner corresponding to the gate delay fault set up, by using the train of transition signal values on various signal lines;
- a second confirmation step, which takes place in the event the first confirmation finds a proper switching operation, for confirming whether or not the output signal line of a load logic gate which input is connected to the output of the faulty logic gate is subject to a switching operation, by using the train of transition signal values on the various signal lines;
- and a step of registering the faulty logic gate with the fault list in the event the second confirmation has confirmed the occurrence of a switching operation.

3. A fault simulation method according to claim 1 in which the step of preparing the fault list takes place in unit of an open fault on a signal line, and comprises

- a step of setting up an open fault which is likely to occur in the semiconductor integrated circuit;
- a first confirmation step of confirming whether or not the faulty signal line having the open fault which is set up is subject to a switching operation, by using the train of transition signal values on various signal lines;
- a second confirmation step, which takes place when the first confirmation has confirmed the occurrence of a switching operation, to confirm whether or not the output signal line of a load logic gate which input is connected to the faulty signal line is subject to a switching operation, by using the train of transition signal values on the various signal lines;
- and a step of registering the faulty signal line with the fault list when the second confirmation has confirmed the occurrence of a switching operation.

4. A fault simulation method according to claim 1 in which the step of preparing the fault list takes place in unit of a path delay fault, and comprises

- a step of setting up a path delay fault which is likely to occur in the semiconductor integrated circuit;
- a step of examining if a transition occurs on every logic gate located on a faulty path which has the path delay fault that is set up, by using the train of transition signal values on various signal lines;
- a step of examining whether or not there is a logic gate on the faulty path which is subject to a transition a plurality of times when every logic gate is subject to a transition;
- in the event there is a logic gate which is subject to a transition a plurality of times, a step of examining if the input to that logic gate satisfies a detection requirement according to the transient power supply current testing;
- and a step of registering the faulty path with the fault list if the input satisfies the detection requirement according to the transient power supply current testing or, if a transition occurs on all of the logic gates and there is no logic gate which is subject to a transition a plurality of times.

5. A fault simulator for preparing a list of detectable faults in a semiconductor integrated circuit, comprising

- means for acquiring test pattern sequence each formed by two or more test patterns;
- a transition simulator for receiving the test pattern sequence and for performing a simulation of transitions which occur in the semiconductor integrated circuit when the test pattern sequence is applied thereto to calculate a train of transition signal values which occur on various signal lines within the circuit;
- and a fault list preparing unit for receiving the train of transition signal values occurring on various signal lines and for preparing a fault list which are detectable by the transient power supply current testing when the test pattern sequence is applied to the semiconductor integrated circuit.

* * * * *